United States Patent
Fan et al.

(10) Patent No.: US 12,237,176 B2
(45) Date of Patent: Feb. 25, 2025

(54) ELECTRONIC DEVICE AND MANUFACTURING METHOD AND INSPECTION METHOD THEREOF USING TRANSMITTANCE OF DIELECTRIC

(71) Applicant: InnoLux Corporation, Miao-Li County (TW)

(72) Inventors: Kuang-Ming Fan, Miao-Li County (TW); Chia-Lin Yang, Miao-Li County (TW); Liang-Lu Chen, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 391 days.

(21) Appl. No.: 17/736,997

(22) Filed: May 4, 2022

(65) Prior Publication Data

US 2023/0049123 A1 Feb. 16, 2023

(30) Foreign Application Priority Data

Aug. 10, 2021 (CN) .......................... 202110914382.9
Jan. 7, 2022 (CN) .......................... 202210016294.1

(51) Int. Cl.
*H01L 21/48* (2006.01)
*H01L 21/66* (2006.01)
*H01L 23/498* (2006.01)

(52) U.S. Cl.
CPC .......... *H01L 21/4857* (2013.01); *H01L 22/12* (2013.01); *H01L 23/49822* (2013.01)

(58) Field of Classification Search
None
See application file for complete search history.

(56) References Cited

U.S. PATENT DOCUMENTS

| 5,851,842 A * | 12/1998 | Katsumata | H01J 37/32935 216/85 |
| 6,072,450 A * | 6/2000 | Yamada | H10K 59/124 313/500 |
| 7,709,849 B1 * | 5/2010 | Kal | H01L 27/153 257/97 |
| 8,709,552 B2 * | 4/2014 | Miyoshi | C08G 73/10 522/143 |

(Continued)

FOREIGN PATENT DOCUMENTS

| CN | 1589590 A | * | 3/2005 | .......... H01L 27/3211 |
| CN | 103700600 A | * | 4/2014 | ............ H01L 22/12 |

(Continued)

OTHER PUBLICATIONS

Saleh. Electromagnetic Optics. Fundamentals of Photonics. (Year: 1991).*

*Primary Examiner* — Binh B Tran
*Assistant Examiner* — Muhammed Azam
(74) *Attorney, Agent, or Firm* — Winston Hsu

(57) ABSTRACT

An electronic device includes a conductive layer, a first dielectric layer, and a second dielectric layer, in which the second dielectric layer is disposed on the first dielectric layer, the conductive layer is disposed between the first dielectric layer and the second dielectric layer, the first dielectric layer has a first transmittance for a light, the second dielectric layer has a second transmittance for the light, and the first transmittance is different from the second transmittance.

19 Claims, 11 Drawing Sheets

(56) References Cited

U.S. PATENT DOCUMENTS

| | | | | |
|---|---|---|---|---|
| 9,001,014 | B2* | 4/2015 | Tsai | G02F 1/133512 |
| | | | | 345/88 |
| 9,099,413 | B2* | 8/2015 | Kim | H10K 71/60 |
| 9,136,504 | B2* | 9/2015 | Smith | H10K 59/876 |
| 9,285,627 | B2* | 3/2016 | Chen | H10K 59/38 |
| 9,582,097 | B2* | 2/2017 | Hsieh | G02F 1/1368 |
| 9,835,897 | B2* | 12/2017 | Chen | H05B 33/14 |
| 9,915,695 | B2* | 3/2018 | Lee | G01R 31/69 |
| 10,074,602 | B2* | 9/2018 | Lee | H01L 21/56 |
| 10,388,690 | B2* | 8/2019 | Jang | H01L 27/153 |
| 10,522,471 | B2* | 12/2019 | Suk | H01L 23/49811 |
| 10,658,182 | B2 | 5/2020 | Russell | |
| 10,707,192 | B2* | 7/2020 | Jingi | H01L 25/0753 |
| 10,785,843 | B2* | 9/2020 | Kao | H10K 59/1213 |
| 10,788,709 | B2* | 9/2020 | Lin | H10K 59/32 |
| 10,825,743 | B2* | 11/2020 | Kao | H01L 27/124 |
| 11,158,836 | B2* | 10/2021 | Lin | H10K 59/38 |
| 11,276,842 | B2* | 3/2022 | Kitahara | G02B 5/08 |
| 11,456,349 | B2* | 9/2022 | Hong | G09G 3/035 |
| 2004/0195963 | A1* | 10/2004 | Choi | H10K 59/351 |
| | | | | 313/506 |
| 2004/0211594 | A1* | 10/2004 | Ho | H05K 3/4007 |
| | | | | 174/257 |
| 2010/0328282 | A1* | 12/2010 | Su | H10K 50/84 |
| | | | | 345/82 |
| 2019/0131350 | A1* | 5/2019 | Kwak | H10K 59/38 |
| 2019/0221527 | A1* | 7/2019 | Bae | H01L 22/14 |
| 2020/0111765 | A1* | 4/2020 | Kim | H01L 21/4853 |
| 2020/0227484 | A1* | 7/2020 | Lin | H10K 59/38 |
| 2021/0191191 | A1* | 6/2021 | Takahashi | H10K 59/351 |
| 2023/0049123 | A1* | 2/2023 | Fan | H01L 22/12 |

FOREIGN PATENT DOCUMENTS

| | | | | |
|---|---|---|---|---|
| CN | 105182595 A | * | 12/2015 | G02B 5/201 |
| CN | 106409876 A | * | 2/2017 | G02B 5/201 |
| CN | 109962047 A | * | 7/2019 | H01L 23/49816 |
| CN | 110389473 A | * | 10/2019 | G02F 1/133514 |
| CN | 110517945 A | * | 11/2019 | |
| CN | 110611024 A | * | 12/2019 | H01L 25/0753 |
| CN | 111627869 A | * | 9/2020 | H01L 21/76838 |
| CN | 111755409 A | * | 10/2020 | |
| EP | 0845770 A1 | * | 6/1998 | |
| EP | 1630605 | | 3/2006 | |
| JP | 2008252039 | | 10/2008 | |
| JP | 2010147463 A | * | 7/2010 | H01L 24/24 |
| KR | 100745352 B1 | * | 8/2007 | |
| KR | 20120087039 A | * | 8/2012 | |
| KR | 20170013910 A | * | 2/2017 | |
| KR | 20190063620 A | * | 6/2019 | |
| KR | 20190086361 A | * | 7/2019 | |
| TW | 200928286 | | 7/2009 | |

* cited by examiner

ELECTRONIC DEVICE AND MANUFACTURING METHOD AND INSPECTION METHOD THEREOF USING TRANSMITTANCE OF DIELECTRIC

BACKGROUND OF THE DISCLOSURE

1. Field of the Disclosure

The present disclosure relates to an electronic device and a manufacturing method and an inspection method thereof, and more particularly to an electronic device used for increasing definition of inspection images and a manufacturing method and an inspection method thereof.

2. Description of the Prior Art

Recently, as electronic devices become smaller and smaller, and more components need to be integrated into the electronic devices, design and quality of metal traces between components will affect reliability of the electronic devices. Therefore, to provide a manufacturing method of an electronic device that is able to improve definition of the inspection images to reduce inspection time or improving inspection ability for defects.

SUMMARY OF THE DISCLOSURE

According to an embodiment of the present disclosure, an electronic device is disclosed and includes a connector. The connector includes a conductive layer, a first dielectric layer, and a second dielectric layer, in which the second dielectric layer is disposed on the first dielectric layer, the conductive layer is disposed between the first dielectric layer and the second dielectric layer, the first dielectric layer has a first transmittance for a light, the second dielectric layer has a second transmittance for the light, and the first transmittance is different from the second transmittance.

According to another embodiment of the present disclosure, a manufacturing method of an electronic device is disclosed. First, a carrier is provided. Next, a connector is formed on the carrier, in which the connector includes a first dielectric layer and a second dielectric layer, the second dielectric layer is disposed on the first dielectric layer, and the second dielectric layer is farther away from the carrier than the first dielectric layer. The first dielectric layer has a first transmittance for a light, the second dielectric layer has a second transmittance for the light, and the first transmittance is different from the second transmittance.

According to another embodiment of the present disclosure, an inspection method of an electronic device is disclosed. First, a carrier is provided. Then, a connector is formed on the carrier, in which the connector includes a first dielectric layer and a second dielectric layer, the second dielectric layer is disposed on the first dielectric layer, the second dielectric layer is farther away from the carrier than the first dielectric layer. After that, a light source is provided for inspecting the connector.

These and other objectives of the present disclosure will no doubt become obvious to those of ordinary skill in the art after reading the following detailed description of the embodiment that is illustrated in the various figures and drawings.

DETAILED DESCRIPTION

Figure 1:
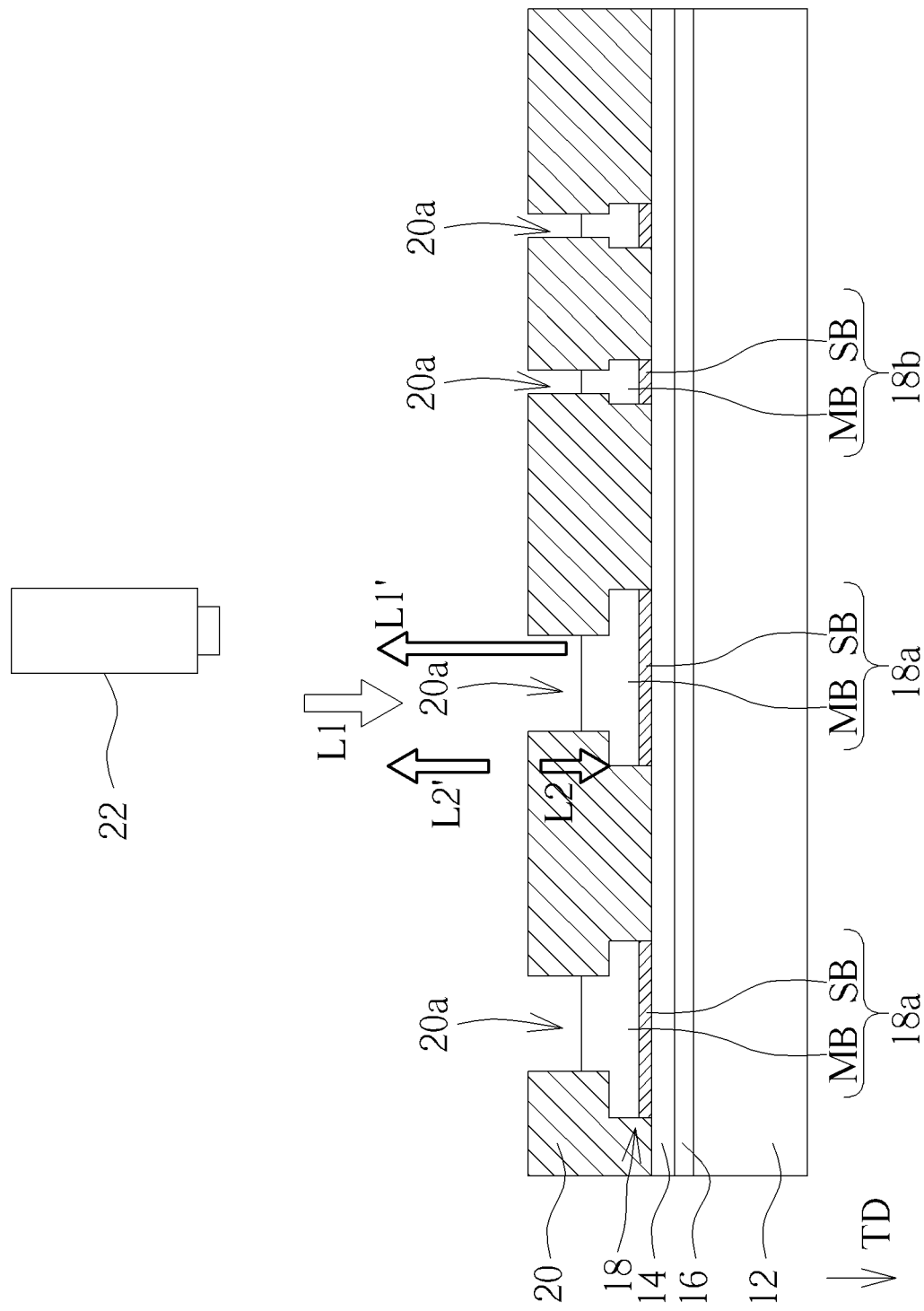
FIG. 1 to FIG. 5 schematically illustrate a manufacturing method of an electronic device according to an embodiment of the present disclosure.

Hereinafter, package devices of embodiments of the present disclosure are detailed in the following description. It should be understood that many different embodiments provided below are implemented to different aspects. The following specific components and arrangements describe some embodiments just for simplicity and clarity. Of course, these are just for example and not for limitation. In addition, similar components may be labeled with similar and/or corresponding reference numerals in different embodiments for clarity of description. However, these similar reference numbers just describe some embodiments simply and clearly, and do not mean that there is any relationship between different embodiments and/or structures discussed herein.

When a first layer is located on or above a second layer, the first layer may be in direct contact with the second layer. Alternatively, one or more other layers may be sandwiched between them, and in this case, the first layer may not be in direct contact with the second layer.

The contents of the present disclosure will be described in detail with reference to specific embodiments and drawings. In order to make the contents clearer and easier to understand, the following drawings may be simplified schematic diagrams, and components therein may not be drawn to scale. The numbers and sizes of the components in the drawings are just illustrative and are not intended to limit the scope of the present disclosure.

Certain terms are used throughout the specification and the appended claims of the present disclosure to refer to specific components. Those skilled in the art should understand that electronic equipment manufacturers may refer to a component by different names, and this document does not intend to distinguish between components that differ in name but not function. In the following description and claims, the terms "comprise", "include" and "have" are open-ended fashion, so they should be interpreted as "including but not limited to . . . " e It should also be understood that when a component is said to be "coupled" to another component (or a variant thereof), it maybe directly connected to another component or indirectly connected (e.g., electrically connected) to another component through one or more components.

When ordinal numbers, such as "first" and "second", used in the specification and claims are used to modify components in the claims, they do not mean and represent that the claimed components have any previous ordinal numbers, nor do they represent the order of a claimed component and another claimed component, or the order of manufacturing methods. These ordinal numbers are just used to distinguish a claimed component with a certain name from another claimed component with the same name.

When a component (e.g., film or region) is called "on another component", it maybe directly on the another component, or there may be other components in between. On the other hand, when a component is called "directly on another component", there is no component between them. In addition, when a component is called "on another component", there is an upper and lower relationship between the two components in a top view direction, and this component may be above or below the other component, and this upper and lower relationship depends on the orientation of the device.

In this document, the terms "about", "substantially" and "approximately" usually mean within 10%, 5%, 3%, 2%, 1% or 0.5% of a given value or range. The quantity given here is about the quantity, that is, without specifying "about", "substantially" and "approximately", the meanings of "about", "substantially" and "approximately" may still be implied. In addition, the term "range from a first value to a second value" means that the range includes the first value, the second value and other values between them.

It should be understood that according to the following embodiments, features of different embodiments may be replaced, recombined or mixed to constitute other embodiments without departing from the spirit of the present disclosure. As long as the features of the embodiments do not violate the inventive spirit or conflict with each other, they can be mixed and used at will.

Unless otherwise defined, all terms used herein (including technical and scientific terms) have the same meanings as those commonly understood by those skilled in the art to which the present disclosure belongs. It can be understood that these terms, such as those defined in commonly used dictionaries, should be interpreted as meanings consistent with the background or context of related technologies and the present disclosure, and should not be interpreted in an idealized or overly formal way, unless it is specifically defined in the embodiments of the present disclosure.

The electronic device of the present disclosure may include a package device, a display device, an antenna device, a touch display device, a curved display device, a lighting device, a diode device or a free shape display device but is not limited thereto. The electronic device may be a bendable or flexible electronic device. The electronic device may include, for example, a light emitting diode, liquid crystal molecules, a fluorescent material, a phosphor material, other suitable display medium, or a combination thereof, but not limited thereto. The light emitting diode may include, for example, an organic light-emitting diode (OLED), an inorganic light-emitting diode (LED), a mini-light-emitting diode (mini LED), a micro-light-emitting diode (micro-LED), a quantum dot (QD) light-emitting diode (such as QLED, or QDLED), other suitable materials or any combination thereof, but not limited thereto. The display device may include, for example, a tiled display device, but not limited thereto. The concepts or principles of the present disclosure may be applied to non-self-luminous liquid crystal display (LCD), but not limited thereto.

The antenna device may be, for example, a liquid crystal antenna or other types of antennas, but not limited thereto. The antenna device may include, for example, a tiled antenna device, but not limited thereto. It should be noted that, the electronic device maybe any combination of the devices mentioned above, but not limited thereto. In addition, a shape of the electronic device may be rectangular, circular, polygonal, a shape with curved edges, or other suitable shapes. The electronic device may have a peripheral system such as a driving system, a control system, a light source system, a shelf system, etc. to support the display device, the antenna device or the tiled device. The electronic device of the present disclosure may be, for example, a display device, but not limited thereto.

Figure 2:
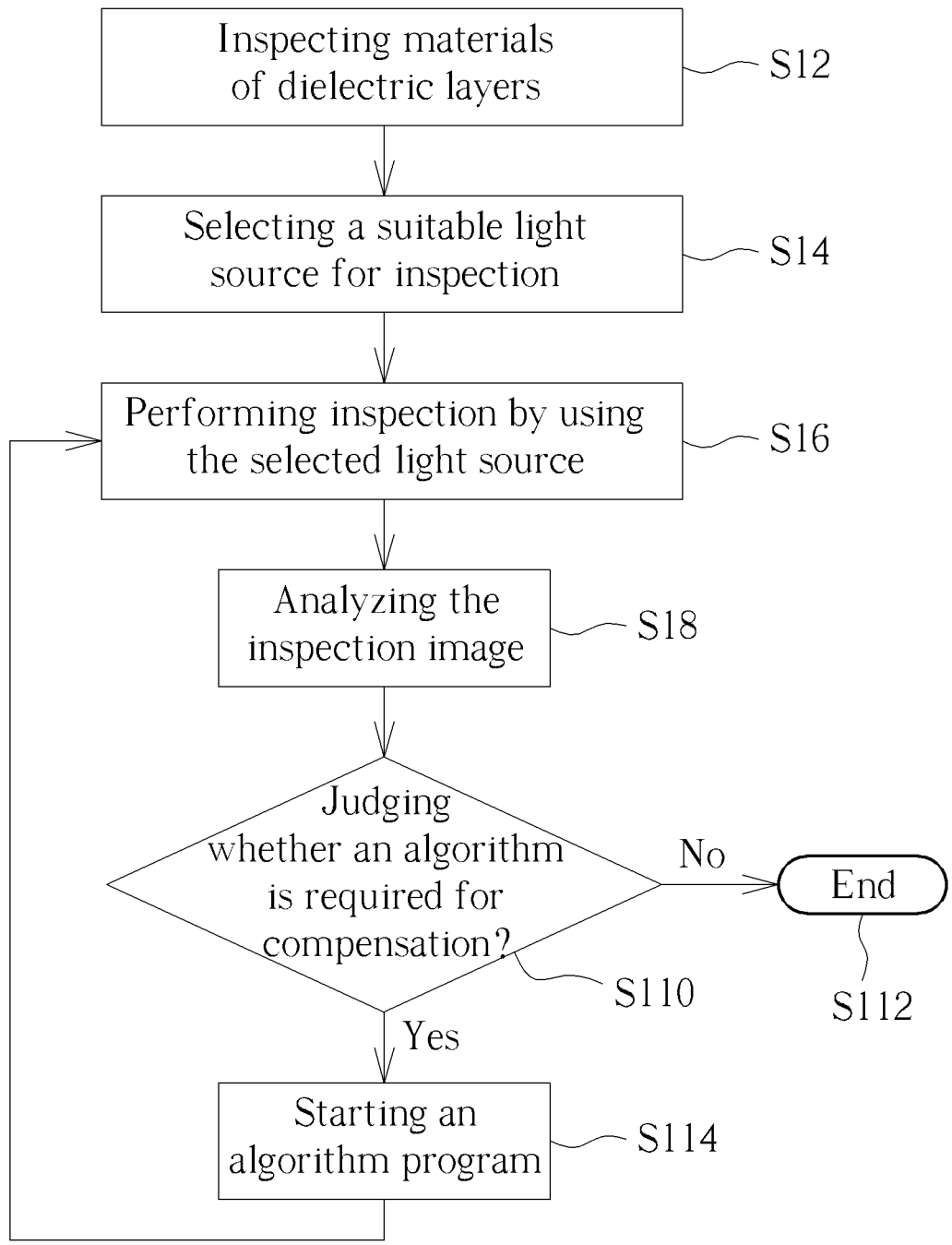
Figure 3:
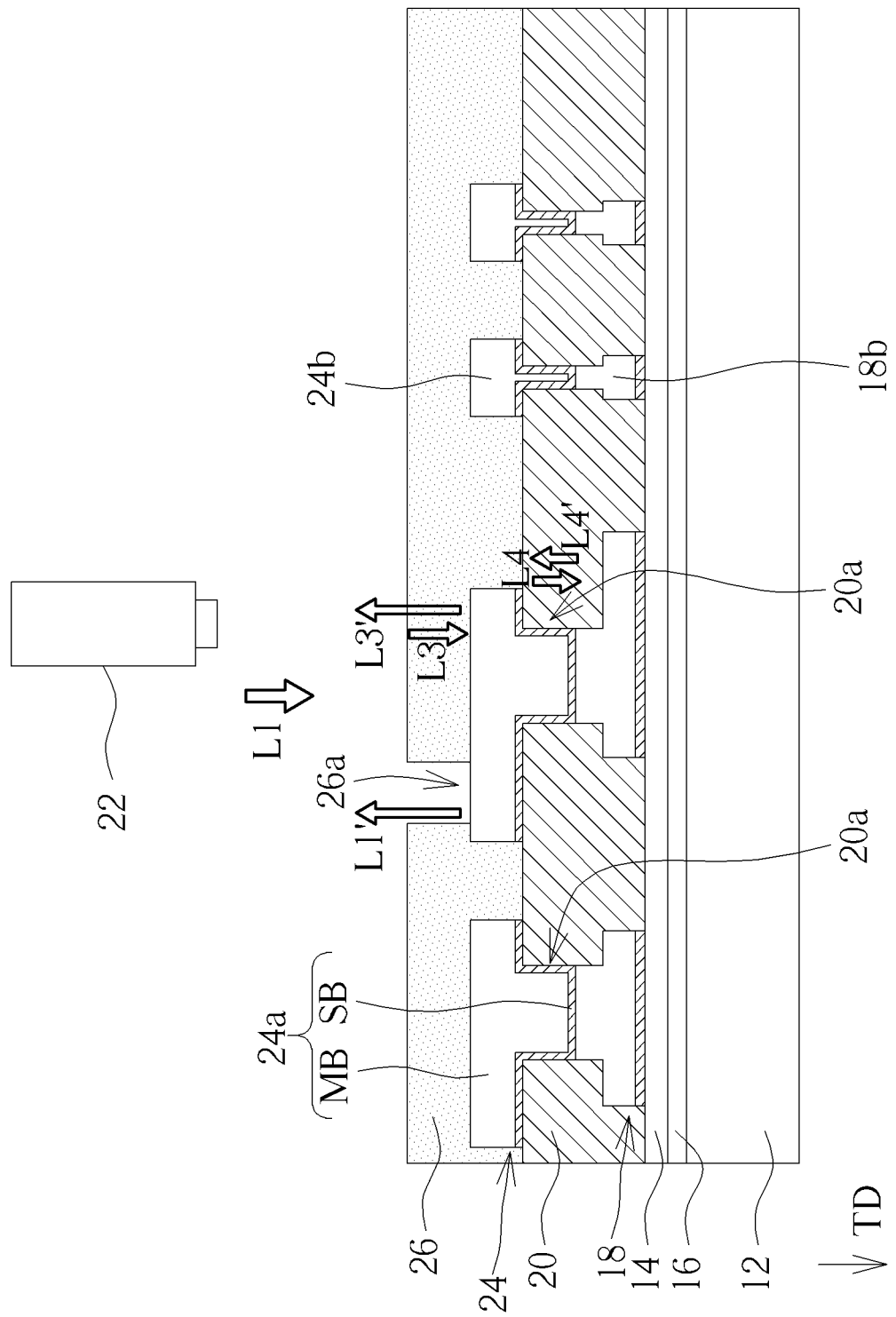
Figure 4:
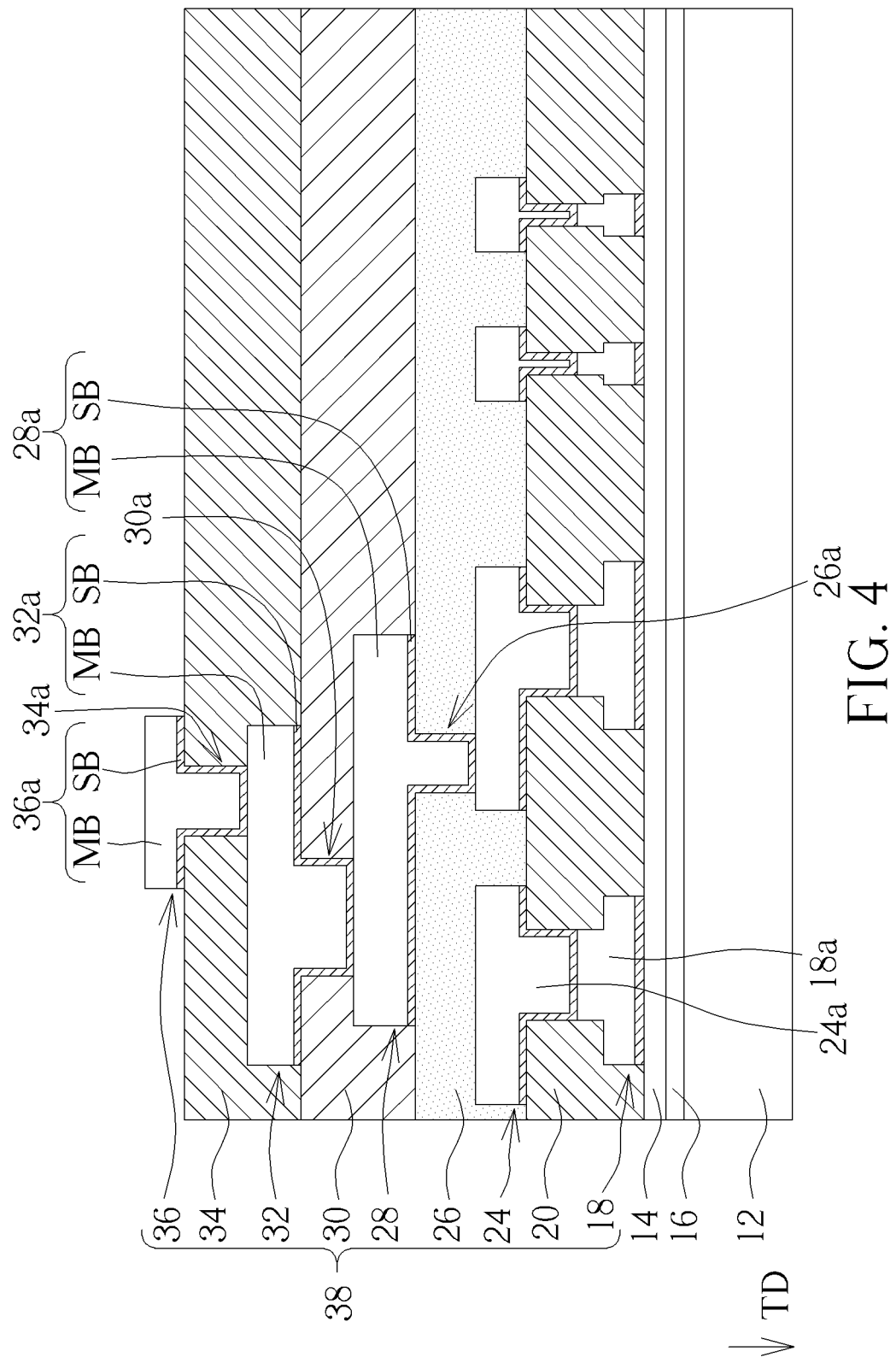
Figure 5:
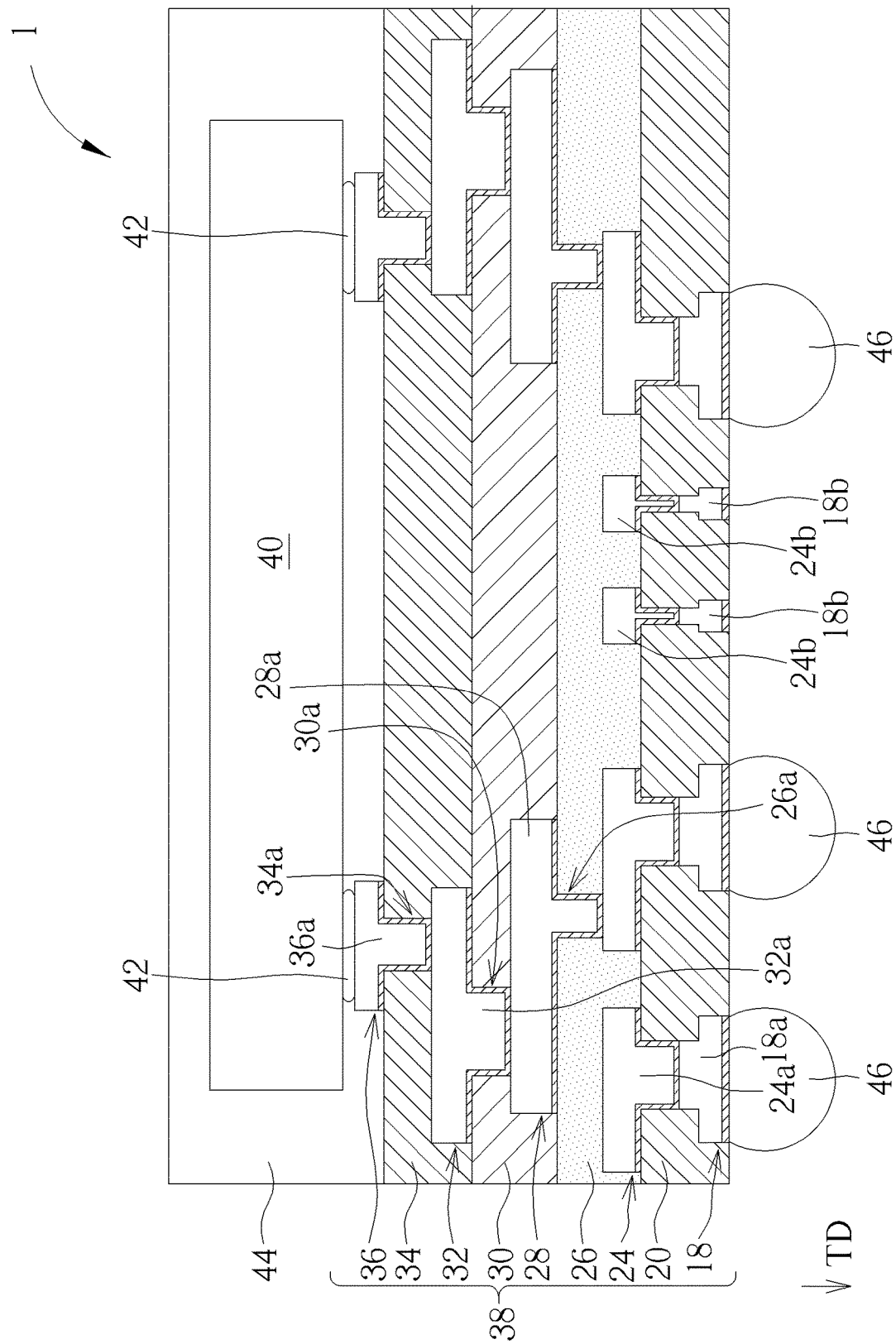

FIG. 1 to FIG. 5 schematically illustrate a manufacturing method (or an inspection method) of an electronic device according to an embodiment of the present disclosure, in which FIG. 1 and FIG. 3 to FIG. 5 illustrate cross-sectional structures in different steps for manufacturing an electronic device according to an embodiment of the present disclosure. FIG. 2 schematically illustrates a flowchart of an inspection process according to an embodiment of the present disclosure, and FIG. 5 schematically illustrates a cross-sectional view of an electronic device according to an embodiment of the present disclosure. For clarity, FIG. 1 and FIG. 3 to FIG. 5 show partial cross-sectional structures in different steps, but not limited thereto. As shown in FIG. 1, a carrier 12 is first provided to carry a connector formed later, in which the connector may have a stack of multiple dielectric layers and multiple conductive layers, such as the connector 38 shown in FIG. 4. The carrier 12 may be, for example, a rigid substrate. For example, the rigid substrate may include a glass, a wafer, an external component, an external component surrounded by an encapsulation structure (such as the encapsulation structure 44 shown in FIG. 5), or other substrates suitable for supporting or forming the connector 38, in which the encapsulation structure may include, for example, polycarbonate (PC), polyimide (PI), polyethylene terephthalate (PET), resin, epoxy resin, organic silicon compound, or a combination thereof, but not limited thereto. In some embodiments, the carrier 12 may also include a flexible substrate and be disposed on the rigid carrier, and the flexible substrate may include, for example, PI or PET, but not limited thereto. Then, a release layer 14 is formed on the carrier 12. The release layer 14 includes a release material with release ability to separate the carrier 12 from a formed device after subsequent steps are completed. For example, the carrier 12 may be separated from the formed device by thermal release or by optical release, but not limited thereto. The release layer 14 of the present disclosure may include, for example, a polyethylene (PE) release film, a PET release film, an oriented polypropylene (OPP) release film, a composite release film (i.e., a substrate composed of two or more materials), but not limited thereto.

In some embodiments, as shown in FIG. 1, before forming the release layer 14, an insulating layer 16 may be formed on the carrier 12, such that the insulating layer 16 may be disposed between the carrier 12 and the release layer 14. The insulating layer 16 as referred in the present disclosure may be, for example, a stress layer. The stress layer, for example, may be used to mitigate stress generated in the connector fabricated in the following step, thereby reducing warpage of the electronic device, but not limited thereto. For example, the insulating layer 16 may include silicon nitride or other suitable materials. A thickness of the insulating layer 16 may be greater than or equal to 0.5 micrometers ($\mu$m) and less than or equal to 5 $\mu$m (0.5 $\mu$m≤the thickness of the insulating layer 16≤5$\mu$m), but not limited thereto.

As shown in FIG. 1, after the release layer 14 is formed, a first conductive layer 18 is formed on the release layer 14. The first conductive layer 18 may include at least one lower pad 18a. In the embodiment of FIG. 1, the number of the lower pads 18a may be plural, but not limited thereto. In some embodiments, the method of forming the first conductive layer 18 may include forming a seed layer (not shown) on the release layer 14 first and then forming a photoresist pattern on the seed layer, in which the photoresist pattern has at least one opening exposing a portion of the seed layer corresponding to the lower pad 18a. Subsequently, a metal layer is formed on the exposed seed layer, and the metal layer may include at least one metal block MB disposed in the corresponding opening. In some embodiments, the method of forming the metal layer may be optionally performed by an electroplating process, an electroless plating process, a physical vapor deposition process or other suitable processes. After the metal layer is formed, the photoresist pattern is removed to expose a portion of the seed layer under the photoresist pattern, and the portion of the seed layer that is not covered by the metal layer is removed by an etching process to form at least one seed block SB that is disposed under a corresponding metal block MB. In other words, the lower pad 18a may include the seed block SB and the metal block MB stacked in sequence. In some embodiments, as shown in FIG. 1, a cross-sectional shape of the lower pad 18a may be, for example, an inverted T shape, but not limited thereto.

As shown in FIG. 1, a first dielectric layer 20 is then formed on the first conductive layer 18 and the carrier 12, and at least one through hole 20a is formed in the first dielectric layer 20 to expose the corresponding lower pad 18a. That is to say, the first conductive layer 18 is disposed under the first dielectric layer 20. In other words, the first conductive layer 18 and the first dielectric layer 20 stacked in sequence. In the embodiment of FIG. 1, the number of the through holes 20a may be plural, but not limited thereto. The method of forming the first dielectric layer 20 may include, for example, a coating process in combination with a photolithography process or in combination with an exposure process and a development process, but not limited thereto. In some embodiments, the first dielectric layer 20 may include insulating materials, for example, PI, photosensitive polyimide (PSPI) or other suitable insulating materials, but not limited thereto.

As shown in FIG. 1, after the through hole 20a is formed, an inspection process may be performed to inspect a relative relationship between the first dielectric layer 20 and the first conductive layer 18 and/or an appearance of the first dielectric layer 20 by an optical inspection system. For example, whether the formed through hole 20a is aligned to the corresponding lower pad 18a in a top view direction TD is inspected. The optical inspection system may, for example, include an automatic optical inspection (AOI) system or other suitable inspection systems. In the embodiment of FIG. 1, the optical inspection system may, for example, include an inspection device 22, which may include alight source for generating light L1 and an image sensor for receiving light L2 reflected from the first dielectric layer 20 and the first conductive layer 18, but not limited thereto. In some embodiments, the optical inspection system may further include other components, such as components for analyzing images or for controlling the inspection process, but not limited thereto. The "top view direction TD" herein may be, for example, a direction opposite to a stacking direction of a portion of the first conductive layer 18 that does not correspond to the through hole 20a and the first dielectric layer 20 disposed on the portion of the first conductive layer 18 or a direction opposite to an alternate stacking direction of the dielectric layers and the conductive layers in the connector 38 herein, but not limited thereto.

Refer further to FIG. 2 as well as FIG. 1. FIG. 2 schematically illustrates a flowchart of a first inspection process according to an embodiment of the present disclosure. The first inspection process may include a step S12 to a step S114. The step S12 is first performed to inspect materials or appearances of a formed dielectric layer (such as the first dielectric layer 20) and a dielectric layer to be formed (such as another dielectric layer formed later) through the optical inspection system, but not limited thereto. For example, the material information of the formed dielectric layer and the dielectric layer to be formed may be stored or set in the optical inspection system, and the material of each dielectric layer may be confirmed by the optical inspection system. In some embodiments, the optical inspection system may inspect whether the formed dielectric layer has defects, such as holes or slight cracks, but not limited thereto. Then, the step S14 is performed to select a suitable light source for inspection according to the color or material of each dielectric layer (e.g., the first dielectric layer 20 and the second dielectric layer 26, the third dielectric layer 30 and the fourth dielectric layer 34 mentioned below). The suitable light source may, for example, be capable of generating the light L1 having a wavelength range. In the embodiment of FIG. 1, the wavelength range of the light L1 of the light source may, for example, be from 380 nanometers (nm) to 780 nm. For example, the light L1 maybe white light, but not limited thereto. In some embodiments, the wavelength range of the light L1 may, for example, be from 440 nm to 485 nm, from 550 nm to 565 nm, or from 625 nm to 740 nm, but not limited thereto. Alternatively, the color of the light L1 may be, for example, blue, green or red, but not limited thereto. It should be noted that the "wavelength range" mentioned herein may refer to a distribution range from a wavelength to another wavelength, but is not limited thereto. The "color" of light mentioned herein may, for example, refer to the light having a maximum peak in a corresponding wavelength range. For example, in a visible light spectrum, red light may have the maximum peak in a wavelength range of 620 nm to 750 nm, similarly green light may have a maximum peak in a wavelength range of 500 nm to 565 nm, or blue light may have a maximum peak in a wavelength range of 485 nm to 500 nm, but not limited thereto. In some embodiments, the light L1 may not have a single wavelength range but may have at least two wavelength ranges.

As shown in FIG. 1 and FIG. 2, the step S16 is then performed to perform inspection by using the selected light source, that is, the light L1 of the light source is emitted to the formed first dielectric layer 20 and the patterned lower pad 18a along the top view direction TD. For example, at least a part of the light L1 may penetrate through the first dielectric layer 22 and be emitted toward the lower pad 18a of the first conductive layer 18. Since the first dielectric layer 20 may have a first transmittance (%) for the light L1 of the light source, after the light L1 enters the first dielectric layer 20, the light L1 is partially absorbed by the first dielectric layer 20 and partially penetrates through the first dielectric layer 20 to form the light L2. The light L2 is further reflected by the lower pad 18a of the first conductive layer 18 and then penetrates through the first dielectric layer 20 to be emitted from an upper surface of the first dielectric layer 20 and form a light L2. Accordingly, the inspection device 22 may receive the light L2' emitted from the upper surface of the first dielectric layer 20 to obtain an inspection image. Then, the step S18 is performed to analyze the inspection image by the optical inspection system, and in the step S110, whether the inspection image is clear enough is determined to judge whether an algorithm is required for compensation. In the embodiment of FIG. 1, since there is no other conductive layer between the first conductive layer 18 and the carrier 12, the optical inspection system may detect a clear enough inspection image. Thus, through the inspection image, whether the pattern of the lower pad 18a of the first conductive layer 18 meets a product standard may be determined. For example, it may be determined whether the pattern of the lower pad 18a of the first conductive layer 18 overlapping the first dielectric layer 20 is whole in the top view direction TD to judge whether electrical property or reliability of a product is affected, thereby facilitating proposing solutions quickly or increasing production efficiency, but not limited thereto. In some embodiments, the light L1 of the light source is emitted to the lower pad 18a exposed by the through hole 20a substantially along the top view direction TD, and the light L1 is reflected by the exposed lower pad 18a to form a light L1'. Therefore, the inspection device 22 may receive the light L1' to obtain an inspection image. Since the optical inspection system may inspect a clear enough inspection image, a relative relationship between the through hole 20a of the first dielectric layer 20 and an edge of the lower pad 18a of the first conductive layer 18 may be determined through the inspection image, and for example, it may be determined whether the through hole 20a exposes the corresponding lower pad 18a in the top view direction TD. Accordingly, whether the following processes are affected may be judged, thereby facilitating proposing solutions quickly or increasing producing efficiency, but not limited thereto. Then, the step S112 is performed to end the first inspection process. When the inspection image is not clear enough and does not meet the product standard, the optical inspection system may determine that the algorithm is required for compensation, so that the step S114 is further performed to start an algorithm program, and the first inspection process returns to the step S16 to perform inspection on the first dielectric layer 20 and the first conductive layer 18 again by using the selected light source to obtain another inspection image. The first inspection process is not ended until the inspection image is clear enough. In some embodiments, since there is no other conductive layer between the first conductive layer 18 and the carrier 12, the optical inspection system may detect the clear enough inspection image, and thus, it does not need to perform the step S110 and the step S114 in the first inspection process. The transmittance (%) of the dielectric layer for light in the present disclosure is a percentage of the light penetrating through a sample to all incident light, and for example, the transmittance may be a maximum transmittance of the dielectric layer for the light, in which the transmittance may be obtained by using a suitable optical measuring instrument to test the dielectric layer. For example, a scanning electron microscope (SEM) and a focused ion beam (e.g., dual-beam FIB) may be used to analyze a thickness of the dielectric layer, and a drilling process, such as laser drilling, may be used to produce a sample with a size suitable for testing by the optical measuring instrument according to the thickness information of the dielectric layer. Through measuring the sample of the dielectric layer mentioned above, the transmission spectrum of the dielectric layer or the transmittance of the dielectric layer for specific wavelength range may be obtained. The optical measuring instrument mentioned in the present disclosure may be, for example, a brightness meter, a transmittance measuring instrument, an optical microscope, other suitable instruments or combinations thereof, but not limited thereto.

As shown in FIG. 3, after the above-mentioned first inspection process is completed, a second conductive layer 24 may be formed on the first dielectric layer 20, in which the second conductive layer 24 may include at least one conductive block 24a, and the conductive block 24a may extend from a top of the first dielectric layer 20 into the through hole 20a of the first dielectric layer 20 to be electrically connected to the corresponding lower pad 18a. In other words, a portion of the conductive block 24a is disposed on the top surface of the first dielectric layer 20, and another portion of the conductive block 24a is disposed in the through hole 20a of the first dielectric layer 20. The method of forming the second conductive layer 24 may be, for example, similar to or the same as the method of forming the first conductive layer 18 and will not be mentioned redundantly. The conductive block 24a may also include, for example, a seed block SB and a metal block MB, but not limited thereto. In the embodiment of FIG. 3, the second conductive layer 24 may comprise a plurality of conductive blocks 24a separated from each other, and the conductive blocks 24a may be electrically connected to the corresponding lower pads 18a respectively, but not limited thereto. The conductive blocks 24a may be, for example, traces, electrodes, circuits or blocks with other functions, but not limited thereto.

As shown in FIG. 3, a second dielectric layer 26 is then formed on the first dielectric layer 20 and the second conductive layer 24, in which the second dielectric layer 26 is farther from the first conductive layer 18 than the first dielectric layer 20. The second conductive layer 24 is disposed between the first dielectric layer 20 and the second dielectric layer 26, and the second dielectric layer 26 may comprise at least one through hole 26a to expose the corresponding conductive block 24a. The method of forming the second dielectric layer 26 may include, for example, a coating process in combination with a photolithography process and an etching process or in combination with an exposure process and a development process, but not limited thereto. The second dielectric layer 26 may include, for example, PI or photosensitive PI, but not limited thereto. In some embodiments, at least one conductive block 24a in the second conductive layer 24 may not be exposed by the through hole 26a, but not limited thereto. After the second conductive layer 24 and the second dielectric layer 26 are formed, a second inspection process may be performed on a relative relationship between the second dielectric layer 26 and the second conductive layer 24 and/or a pattern of the conductive block 24a of the second conductive layer 24 by the optical inspection system. In one embodiment, the second inspection process may be similar to or the same as the above-mentioned first inspection process and may also include the step S12 to the step S114.

It should be noted that, as shown in FIG. 3, in the step S16 of performing the second inspection process, the light L1 of the light source may be emitted toward the formed second dielectric layer 26 and the patterned conductive block 24a substantially along the top view direction TD. A part of the light L1 may penetrate through the through hole 26a and be emitted to the conductive block 24a through the through hole 26a, and then, the part of the light L1 may be reflected by the exposed conductive block 24a to form the light L1'. Since the second dielectric layer 26 may have a second transmittance for the light L1, the light L1 entering the second dielectric layer 26 is partially absorbed by the second dielectric layer 26 and partially penetrates through the second dielectric layer 26 to form the light L3 and be emitted to the conductive block 24a and an interface between the second dielectric layer 26 and the first dielectric layer 20. A part of the light L3 may be reflected by the conductive block 24a to form light L3' after penetrating through the second dielectric layer 26, so the light L3' emitted from an upper surface of the second dielectric layer 26 may have pattern information of the conductive block 24a. Another part of the light L3 may enter the first dielectric layer 20. Since the first dielectric layer 20 may have a third transmittance for the light L3, the another part of the light L3 entering the first dielectric layer 20 may be partially absorbed by the first dielectric layer 20 and partially penetrate through the first dielectric layer 20 to form light L4. The light L4 may penetrate through the first dielectric layer 20 and be reflected by the lower pad 18a to form light L4'. Since the light L4' is formed by the light L1 being absorbed by the second dielectric layer 26 and the first dielectric layer 20, the light L4' may enter the second dielectric layer 26 and be emitted from the upper surface of the second dielectric layer 26 after being reflected. The light L4' may have pattern information of the lower pad 18a. Through the above method, the inspection device 22 disposed above the second dielectric layer 26 may receive, for example, the light L1' emitted from the through hole 26a and the light L3' and the light L4' emitted from the upper surface of the second dielectric layer 26 to obtain an inspection image, thereby improving the inspection ability. Accordingly, the defects during the processes may be corrected in real time, and/or reliability of the electronic device may be improved, but not limited thereto. A second transmission spectrum of the second dielectric layer 26 may be different from the first transmission spectrum of the first dielectric layer 20. Therefore, the first dielectric layer 20 may have the first transmittance for the light L1, and the second dielectric layer 20 may have the second transmittance for the light L1, in which the first transmittance may be different from the second transmittance. The second dielectric layer 26 may have the second transmittance for the light L1, such that the light L1 penetrating through the second dielectric layer 26 may form the light L3, and accordingly, a transmittance of the second dielectric layer 26 for the light L3 may be different from a third transmittance of the first dielectric layer 20 for the light L3. For example, the difference between the transmittance of the second dielectric layer 26 for the light L3 and the third transmittance of the first dielectric layer 20 for the light L3 may be greater than or equal to 10%, the difference between the transmittance of the second dielectric layer 26 for the light L3 and the third transmittance of the first dielectric layer 20 for the light L3 may be greater than or equal to 30%, the difference between the transmittance of the second dielectric layer 26 for the light L3 and the third transmittance of the first dielectric layer 20 for the light L3 may be greater than or equal to 50%, or the difference between the transmittance of the second dielectric layer 26 for the light L3 and the third transmittance of the first dielectric layer 20 for the light L3 maybe greater than or equal to 70%. The first dielectric layer 20 may completely absorb the light L3 optimally. Through the arrangement mentioned above, interference between the pattern information of the conductive block 24a and the pattern information of the lower pad 18a may be mitigated during the inspection process, thereby increasing determining efficiency, but not limited thereto. In addition, an intensity of the light L4 formed by the light L3 after being absorbed by the first dielectric layer 20 may be less than or significantly less than an intensity of the light L3, or the first dielectric layer 20 may substantially absorb all the light L3, so there is almost no reflected light L4'. Therefore, the inspection device 22 may receive clear pattern information of the conductive block 24a and blurred or even unclear pattern information of the lower pad 18a, so that the optical inspection system may easily detect the through hole 26a of the second dielectric layer 26 and the pattern of the second conductive layer 24 from the inspection image, and for example, they may be recognized without additional algorithm program. In this way, the detection rate of defects in the second dielectric layer 26 and the second conductive layer 24 may be improved, or the inspection time of the second dielectric layer 26 and the second conductive layer 24 may be shortened. Since other steps of the second inspection process may be similar to or the same as the first inspection process, they are not repeated herein.

As shown in FIG. 3, it should be noted that the first dielectric layer 20 and the second dielectric layer 26 may further include dyes (compounds) with specific colors, respectively, so that the first dielectric layer 20 and the second dielectric layer 26 may have different colors. The color mentioned in the present disclosure may be, for example, a color of an object that the observer visually perceives. Further, when the first dielectric layer 20 and the second dielectric layer 26 respectively include dyes with specific colors, the first dielectric layer 20 may have the first transmittance for the light L1, and the second dielectric layer 26 may have the second transmittance for the light L1. The transmission spectrum of a single dielectric layer mentioned herein is a relationship between wavelength and transmittance measured for the corresponding single dielectric layer. The manner that the light is absorbed by or penetrates through the first dielectric layer 20 and the second dielectric layer 26 is further described below. In the embodiment of FIG. 3, the first transmission spectrum of the first dielectric layer 20 may be different from the second transmission spectrum of the second dielectric layer 26, so that the first dielectric layer 20 and the second dielectric layer 26 may be used to filter out light with different wavelength ranges, respectively. Specifically, the second transmission spectrum may have a transmittance and a wavelength corresponding to the transmittance in the range of 380 nm to 780 nm, and the transmittance of the second transmission spectrum may be different from the transmittance of the first transmission spectrum at the wavelength. For example, one of the first dielectric layer 20 and the second dielectric layer 26 may include one of a green filter material, a yellow filter material, a blue filter material, and a red filter material, and another one of the first dielectric layer 20 and the second dielectric layer 26 may include another one of the green filter material, the yellow filter material, the blue filter material, and the red filter material.

Figure 6:
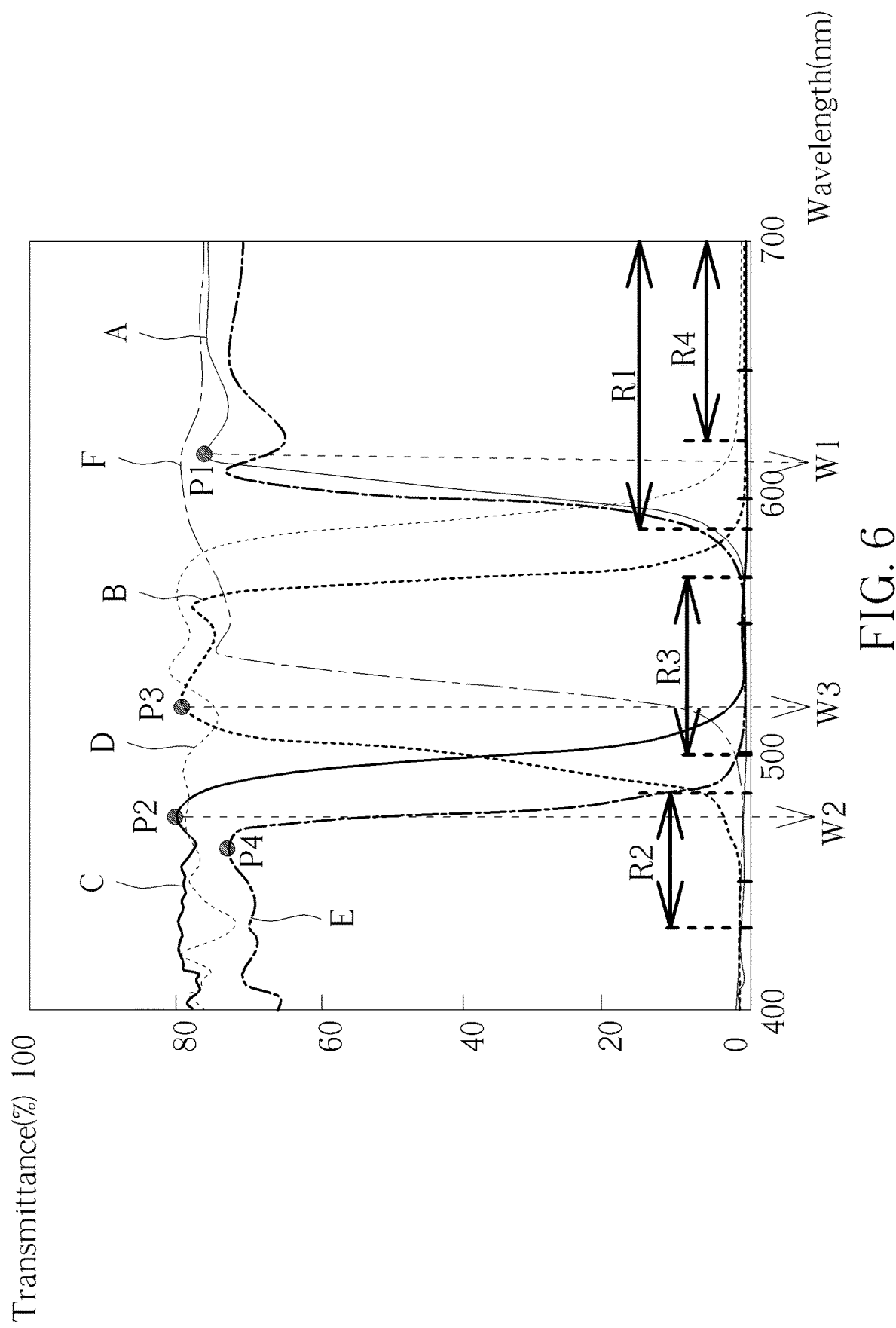
FIG. 6 is a schematic diagram illustrating a transmission spectrum of a dielectric layer according to an embodiment of the present disclosure.

FIG. 6 is a schematic diagram illustrating a transmission spectrum of a dielectric layer according to an embodiment of the present disclosure. As shown in FIG. 6, curve A represents a transmission spectrum of the red filter material, curve B represents a transmission spectrum of the green filter material, curve C represents a transmission spectrum of the blue filter material, curve D represents cyan filter material, curve E represents a transmission spectrum of the magenta filter material, and curve F represents a transmission spectrum of the yellow filter material. The color of the filter material may, for example, refer to a color of white light after penetrating through the corresponding filter material. The transmission spectra of different color filter materials in FIG. 6 are as an example, and the colors and transmission spectra of the dielectric layers of the present disclosure are not limited thereto. For example, in the embodiments of FIG. 3 and FIG. 6, when the wavelength of the light L1 of the light source range from 380 nm to 780 nm (380 nm≤the wavelength of the light L1≤780 nm), the second transmission spectrum of the second dielectric layer 26 may be, for example, a transmission spectrum of the red filter material for the light L1 of the light source (e.g., the curve A in FIG. 6), and the first transmission spectrum of the first dielectric layer 20 may be, for example, a transmission spectrum of the green filter material for the light L1 of the light source (e.g., the curve B in FIG. 6), in which the first dielectric layer 20 may have the first transmittance P3 for the light L1, the second dielectric layer 26 may have the second transmittance P1 for the light L1, and the first transmittance P3 may be different from the second transmittance P1. It can be seen from the curve A in FIG. 6 that the second dielectric layer 26 has the greater transmittance P1 for the light with wavelength in the wavelength range R1. In detail, the second dielectric layer 26 has the greater transmittance P1 for the light with wavelength ranging from 580 nm to 780 nm (580 nm≤wavelength≤780 nm), and for example, the transmittance P1 may be greater than or equal to 70%, which means that the light with wavelength ranging from 580 nm to 780 nm may penetrate through the second dielectric layer 26 to form the light L3. Referring to FIG. 6 as well as FIG. 3 again, it can be seen from the curve B in FIG. 6 that the first dielectric layer 20 has a lower transmittance for the light with wavelength ranging from 580 nm to 780 nm, for example has a transmittance less than or equal to 10% or equal to 0%. In this case, the light L3 is almost absorbed by the first dielectric layer 20 or only a small number of the light L3 penetrates through the first dielectric layer 20 and is reflected to form the light L4'. The above design may significantly reduce the light L4' to interfere with the light L3', thereby improving the detection rate of defects. In some embodiments, the second dielectric layer 26 may be, for example, a blue filter material (which transmission spectrum is for example the curve C in FIG. 6), and the first dielectric layer 26 may be, for example, a yellow filter material (which transmission spectrum is for example the curve E in FIG. 6). It can be seen from the curve C in FIG. 6 that the light with wavelength ranging from 380 nm to 480 nm (380 nm≤wavelength≤480 nm) may penetrate through the second dielectric layer 26 to form the light L3, and a transmittance P2 of the second dielectric layer 26 for light with wavelength ranging from 380 nm to 480 nm may be about 80%. Also, as can be seen from the curve E in FIG. 6, the first dielectric layer 20 has a greater transmittance P4 of about 70% for light with wavelength ranging from 380 nm to 480 nm, and in combination with contrast function and the like of the inspection instrument at the same time, the interference of the light L4' with the light L3' may be reduced to increase detection rate of defects. That is to say, the detection rate of defects may be improved by the second dielectric layer 26 having greater transmittance P2 for the light with wavelength ranging from 380 nm to 480 nm than the transmittance P4 of the first dielectric layer 20 and the difference between the transmittance P2 of the second dielectric layer 26 and the transmittance P4 of the first dielectric layer 20 for the light with wavelength ranging from 380 nm to 480 nm being at least greater than or equal to 10%, but not limited thereto. In some embodiments, according to the colors of the first dielectric layer 20 and the second dielectric layer 26, the optical inspection system may select the light L1 of the light source to have a wavelength range of 380 nm to 780 nm (e.g., in the step S14 shown in FIG. 2). When the light L1 has this wavelength range, a wavelength range of the light L3 entering the second dielectric layer 26 may be, for example, from 600 nm to 700 nm (600 nm≤wavelength≤700 nm), but the wavelength range of the first transmission spectrum having greater transmittance may be from 500 nm to 600 nm (500 nm≤wavelength≤600 nm). Thus, the intensity of the light L3 after being absorbed by the first dielectric layer 20 is significantly reduced, and the intensity of the formed light L4 is significantly less than that of the light L3. As a result, although the conductive block 24a may overlap the lower pad 18a of the first conductive layer 18 in the top view direction TD, the intensity of the light L4' penetrating through both the second dielectric layer 26 and the first dielectric layer 20 may be less than that of the light L3' penetrating through the second dielectric layer 26 in the second inspection process, so that the definition of the through hole 26a of the second dielectric layer 26 and the conductive block 24a of the second conductive layer 24 may be significantly greater than the definition of the through hole 20a of the first dielectric layer 20 and the conductive block 18a of the first conductive layer 18 in the inspection image detected from the second inspection process. Accordingly, the through hole 26a of the second dielectric layer 26 and the pattern of the second conductive layer 24 are easily detected from the inspection image. For this reason, the detection rate of defects of the second dielectric layer 26 and the second conductive layer 24 may be improved, or the inspection time of the second dielectric layer 26 and the second conductive layer 24 may be shortened. The first transmission spectrum of the first dielectric layer 20 and the second transmission spectrum of the second dielectric layer 26 of the present disclosure are not limited to the mentioned above. In some embodiments, one of the first transmission spectrum of the first dielectric layer 20 and the second transmission spectrum of the second dielectric layer 26 may be one of the curve A, the curve B, the curve C, the curve E, and the curve F, and another one of the first transmission spectrum of the first dielectric layer 20 and the second transmission spectrum of the second dielectric layer 26 may be another one of the curve A, the curve B, the curve C, the curve E, and the curve F. In some embodiments, the transmittance P1 of the second transmission spectrum may be less than or equal to the transmittance of the first transmission spectrum at the wavelength W1 corresponding to the transmittance P1, when the wavelength range of the light L1 of the light source is from 380 nm to 780 nm. In this case, the second transmission spectrum may have the wavelength range R1 corresponding to transmittance greater than 10%, and an integral of the transmittance of the second transmission spectrum in the wavelength range R1 may be greater than an integral of the transmittance of the first transmission spectrum in the wavelength range R1.

As shown in FIG. 4, after the second inspection process is completed, a third conductive layer 28 may be formed on the second dielectric layer 26 and the second conductive layer 24, in which the third conductive layer 28 may include at least one conductive block 28a, and the conductive block 28a may extend from a top of the second dielectric layer 26 into the through hole 26a of the second dielectric layer 26 to be electrically connected to the corresponding conductive block 28a. The method of forming the third conductive layer 28 may be, for example, similar or the same as the method of forming the second conductive layer 24, and thus will not be repeated herein. In the embodiment of FIG. 4, the conductive block 28a may, for example, overlap the conductive block 24a of the second conductive layer 24 or the lower pad 18a of the first conductive layer 18 in the top view direction TD, but not limited thereto. In some embodiments, the third conductive layer 28 may include a plurality of conductive blocks 28a spaced apart from each other, but not limited thereto.

As shown in FIG. 4, after the third conductive layer 28 is formed, a third dielectric layer 30 is formed on the second dielectric layer 26 and the third conductive layer 28, in which the third dielectric layer 30 may have at least one through hole 30a exposing the corresponding conductive block 28a. The method of forming the third dielectric layer 30 may be similar to or the same as the method of forming the second dielectric layer 26, but not limited thereto. The third dielectric layer 30 may include, for example, PI or photosensitive PI, but not limited thereto. It should be noted that the third dielectric layer 30 may further include a dye (compound) having a specific color, so that the third dielectric layer 30 may have a third transmission spectrum. When the wavelength of the light L1 generated by the light source ranges from 380 nm to 780 nm, the third transmission spectrum may be different from the second transmission spectrum, or the color of the third dielectric layer 30 may be different from that of the second dielectric layer 26. The third dielectric layer 30 may include, for example, one of the green filter material, the yellow filter material, the blue filter material, and the red filter material that is different from the second dielectric layer 26.

In the embodiment of FIG. 4, the third dielectric layer 30 may, for example, include a blue filter material having the third transmission spectrum. The third transmission spectrum may be, for example, the curve C (the transmission spectrum of the blue filter material) shown in FIG. 6. Taking the curve C of FIG. 6 as an example, the wavelength of light ranging from 380 nm to 480 nm (380 nm≤wavelength≤480 nm) may penetrate through the third dielectric layer 30, which means that the transmittance of the third dielectric layer 30 for the light with wavelength ranging from 380 nm to 480 nm is about 80%. It can be seen from the curve A of FIG. 6 that the transmittance of the second dielectric layer 26 for the wavelength ranging from 380 nm to 480 nm (380 nm≤wavelength≤480 nm) is less than or equal to 10%, which means the third transmission spectrum may have a transmittance P2 and a wavelength W2 corresponding to the transmittance P2, and the transmittance P2 of the third transmission spectrum may be greater than that of the second transmission spectrum (e.g., the curve A in FIG. 6) at the wavelength W2. For example, the difference between the transmittance P2 of the third transmission spectrum and the transmittance of the second transmission spectrum at the wavelength W2 may be greater than or equal to 10%. Through the above arrangement, the detection rate of defects maybe improved, but not limited thereto.

In some embodiments, as shown in FIG. 4 and FIG. 6, after the third conductive layer 28 and the third dielectric layer 30 are formed, a third inspection process may be performed to inspect a relative relationship between the through hole 30a of the third dielectric layer 30 and the conductive block 28a of the third conductive layer 28 and/or the pattern of the conductive block 28a of the third conductive layer 28 by the optical inspection system. Although the conductive block 28a may overlap the conductive block 24a of the second conductive layer 24 and/or the lower pad 18a of the first conductive layer 18 in the top view direction TD, the transmittance P2 of the third transmission spectrum (e.g., the curve C of FIG. 6) may be greater than the transmittance of the second transmission spectrum (e.g., the curve A of FIG. 6) at the wavelength W2 in the third inspection process, so that the intensity of light penetrating through both the third dielectric layer 30 and the second dielectric layer 26 may be less than the intensity of light penetrating through the third dielectric layer 30. Accordingly, the definition of the inspection image and the inspection accuracy of the third dielectric layer 30 and the third conductive layer 28 may be improved. In one embodiment, the third inspection process may be similar to or the same as the first inspection process shown in FIG. 2 and include the step S12 to the step S114, so the third inspection process is not detailed herein.

As shown in FIG. 4, after the third inspection process, a fourth conductive layer 32 and a fourth dielectric layer 34 may be further formed on the third conductive layer 28 and the third dielectric layer 30. Since the methods of forming the fourth conductive layer 32 and the fourth dielectric layer 34 maybe similar to or the same as the methods of forming the third conductive layer 28 and the third dielectric layer 30, they will not be redundantly detailed herein. The fourth conductive layer 32 may include at least one conductive block 32a disposed on the third dielectric layer 30 and extending into the through hole 30a to be electrically connected to the corresponding conductive block 28a. The fourth dielectric layer 34 may have at least one through hole 34a exposing the corresponding conductive block 32a. Then, a fourth inspection process may be performed on the fourth conductive layer 32 and the fourth dielectric layer 34, and the fourth inspection process may be similar to or the same as the first inspection process shown in FIG. 2, and thus will not be repeated herein. The fourth dielectric layer 34 may include, for example, PI or photosensitive PI, but not limited thereto. It should be noted that the fourth dielectric layer 34 may further include a dye (compound) having a specific color, so that the fourth dielectric layer 34 may have a fourth transmission spectrum. When the wavelength of the light L1 generated by the light source ranges from 380 nm to 780 nm, the fourth transmission spectrum may be different from the third transmission spectrum, or the color of the fourth dielectric layer 34 may be different from that of the third dielectric layer 30. The fourth dielectric layer 34 may, for example, include one of the green filter material, the yellow filter material, the blue filter material, and the red filter material that is different from the third dielectric layer 30.

In the embodiment of FIG. 4, the fourth dielectric layer 34 may, for example, include the green filter material. The fourth transmission spectrum may be, for example, the curve B (which is a transmission spectrum of the green filter material) shown in FIG. 6. Taking curve B of FIG. 6 as an example, the fourth transmission spectrum may have a transmittance P3 and a wavelength W3 corresponding to the transmittance P3, and the transmittance P3 of the fourth transmission spectrum may be greater than that of the third transmission spectrum (e.g., the curve C shown in FIG. 6) at the wavelength W3. Although the conductive block 32a may overlap the conductive block 28a of the third conductive layer 28, the conductive block 24a of the second conductive layer 24, and/or the lower pad 18a of the first conductive layer 18 in the top view direction TD, the transmittance P3 of the fourth transmission spectrum may be greater than the transmittance of the third transmission spectrum at the wavelength W3 in the fourth inspection process, so that the definition of the inspection image and the inspection accuracy of the fourth dielectric layer 34 and the fourth conductive layer 32 may be improved.

As shown in FIG. 4, after the fourth inspection process, a fifth conductive layer 36 may be formed on the fourth dielectric layer 34, thereby forming the connector 38 on the carrier 12. The fifth conductive layer 36 may include at least one upper pad 36a extending from a top of the fourth dielectric layer 34 into the through hole 34a of the fourth dielectric layer 34 to be electrically connected to the conductive block 32a. The method of forming the fifth conductive layer 36 may be similar to or the same as the method of forming the fourth conductive layer 32 and will not be repeated herein. Each of the conductive block 28a, the conductive block 32a, and the upper pad 36a may include, for example, the seed block SB and the metal block MB sequentially stacked, but not limited thereto. In some embodiments, the above-mentioned metal block MB may, for example, include a single-layer or multilayer structure. The lower pad 18a, the conductive block 24a, the conductive block 28a, the conductive block 32a, and the upper pad 36a may, for example, include copper, titanium, aluminum, molybdenum, nickel, alloys of metals mentioned above, combinations thereof, or other suitable metals, but not limited thereto.

As shown in FIG. 5, after the fifth conductive layer 36 is formed, the release layer 14 and the insulating layer 16 and the carrier 12 under the release layer 14 may be removed to form the electronic device 1. For example, the connector 38 may be removed from the release layer 14 by laser, heating or other suitable methods, thereby removing the insulating layer 16 and the carrier 12 thereunder. The electronic device 1 may be formed by, for example, an RDL first process, but not limited thereto. In some embodiments, a plurality of electronic devices 1 may be formed on the carrier 12, so a cutting process may be performed before or after removing the carrier 12 to separate the electronic devices 1, but not limited thereto. In some embodiments, an external component 40 may be disposed on the upper pad 36a before or after the carrier 12 is removed or after the cutting process. For example, the external component 40 may be provided by bonding, in which the external component 40 mentioned in the present disclosure may be, for example, a circuit board, a chip (IC), a resistor, a capacitor, an inductor, a diode, a printed circuit board (PCB), combinations thereof or other suitable components. Alternatively, the step of disposing the external component 40 may not be performed. In some embodiments, the external component 40 may include, for example, a semiconductor chip and is disposed on the upper pad 36a through conductive bumps 42 or other suitable conductive components to be electrically connected to the connector 38, but not limited thereto. In some embodiments, an encapsulation structure 44 may be optionally formed on the external component 40 and the connector 38 to protect the external component 40. In some embodiments, a conductive adhesive 46 may be optionally disposed on a lower surface of the lower pad 18a to be electrically connected to other electronic components. The conductive adhesive 46 may, for example, include solder balls or other suitable components. In some embodiments, the connector 38 may be, for example, a fan-out circuit structure applied to a package device, and the fan-out circuit structure may be, for example, a redistribution circuit that maybe used to achieve a high-density integrated circuit (IC), but not limited thereto. In some of the embodiments, the redistribution circuit may include thin film transistor, capacitor, resistor or element, but not limited thereto.

In the embodiment of FIG. 5, the connector 38 may include the first conductive layer 18, the first dielectric layer 20, the second conductive layer 24, the second dielectric layer 26, the third conductive layer 28, the third dielectric layer 30, the fourth conductive layer 32, the fourth dielectric layer 34, and the fifth conductive layer 36. The number of the dielectric layers and the conductive layers in the connector 38 of the present disclosure are not limited as shown in FIG. 5. In some embodiments, the number of dielectric layers in the connector 38 may be, for example, at least two, and the number of conductive layers may be, for example, at least three, but not limited thereto. The external components may be electrically connected to each other through the connector 38 of the electronic device 1 of the present disclosure. For example, the electronic device 1 of the present disclosure may be, for example, a package device, and the connector 38 may be, for example, a redistribution layer of the package device, but not limited thereto. In detail, in the packaging technology, a plurality of package devices may be fabricated at the same time by performing a redistribution layer process on the carrier 12. During fabricating the redistribution layer, the conductive layers and the dielectric layers are alternately formed, and traces of different conductive layers are electrically connected to each other by the through holes in the dielectric layers. In some embodiments, the conductive block 24a, the conductive block 28a, and the conductive block 32a in the connector 38 of the present disclosure may be, for example, traces, electrodes, circuits, or blocks with other functions. The upper pad 36a maybe electrically connected to the corresponding lower pad 18a through the corresponding conductive block 32a, the corresponding conductive block 28a and the corresponding conductive block 24a, but not limited thereto. It should be noted that since the transmission spectrums of any two adjacent dielectric layers of the first dielectric layer 20, the second dielectric layer 26, the third dielectric layer 30, and the fourth dielectric layer 34 for the same light have different transmittances, the contrast between the pattern of the uppermost dielectric layer and the upmost conductive layer and the patterns of other dielectric layers and other conductive layers during inspection may be increased, thereby improving the detection rate of defects or shortening the inspection time. In addition, when the first dielectric layer 20, the second dielectric layer 26, the third dielectric layer 30 and/or the fourth dielectric layer 34 include PI or photosensitive PI, they may have good permittivity, or may reduce stress in the connector 38, or reduce warpage of the connector 38.

As shown in FIG. 5, in some embodiments, the first conductive layer 18 of the electronic device 1 may further include dummy pads 18b, in which the external component 40 may overlap the dummy pads 18b, and for example, the dummy pads 18b may be used to dissipating heat, or testing capacitors, conductive blocks or other components in the connector 38 or for other uses. The dummy pads 18b may be electrically insulated from the lower pads 18a, for example. In this case, at least one conductive layer in the connector 38 may, for example, include dummy blocks electrically insulated from the conductive blocks. For example, the second conductive layer 24 may include dummy blocks 24b electrically insulated from the conductive blocks 24a, but not limited thereto.

The electronic device and the manufacturing method thereof are not limited to the above-mentioned embodiment and may include different embodiments. In order to simplify the description, different embodiments described below will use the same reference numbers to label components identical to those in the above embodiment. For clearly describing different embodiments, the following contents will describe differences between different embodiments, and the repeated parts will not be detailed redundantly.

Figure 7:
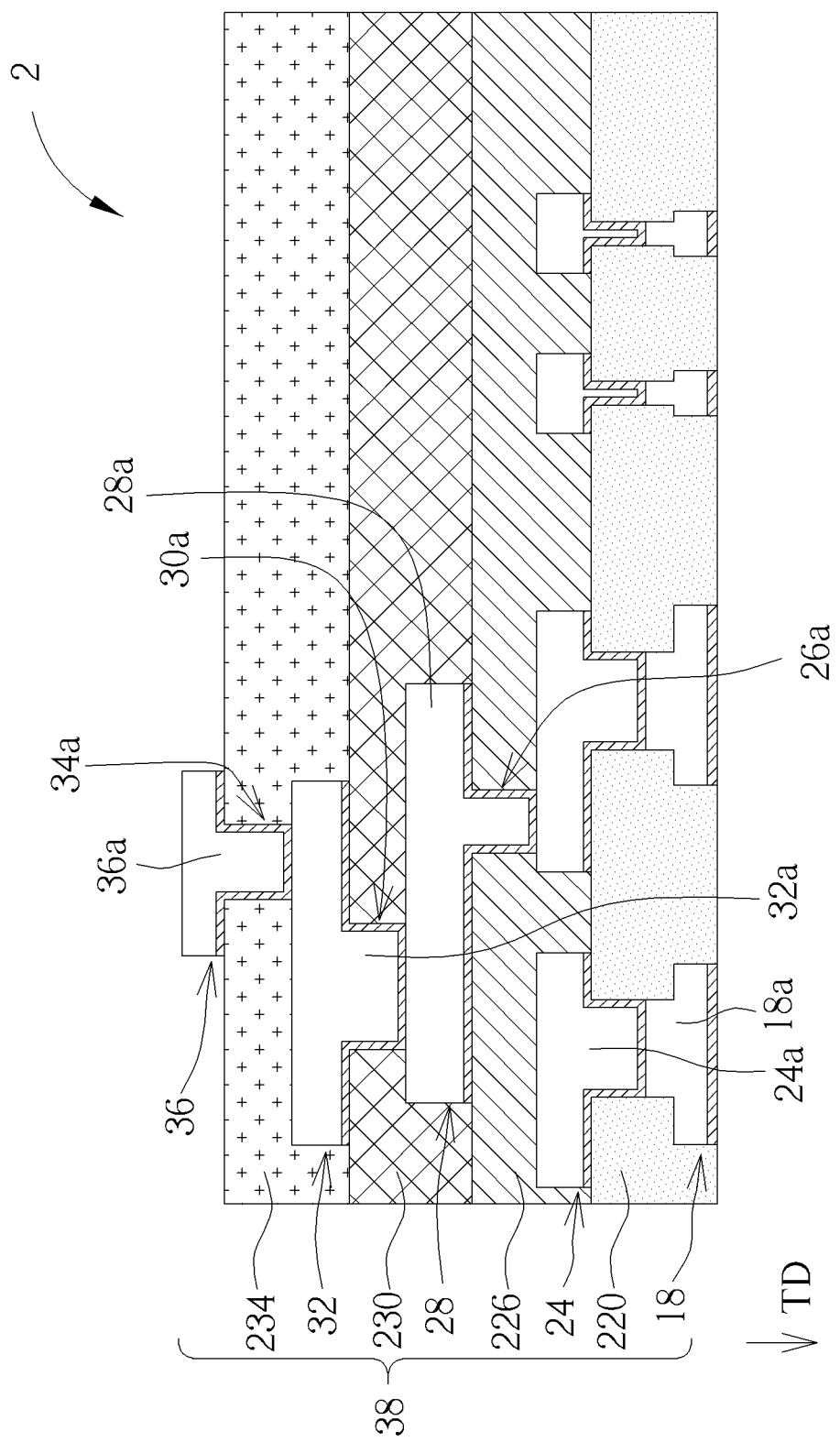
FIG. 7 schematically illustrates a cross-sectional view of an electronic device according to another embodiment of the present disclosure.

FIG. 7 schematically illustrates a cross-sectional view of an electronic device according to another embodiment of the present disclosure. For clarity, FIG. 7 shows a part of the cross-sectional structure, but not limited thereto. As shown in FIG. 7, the electronic device 2 provided by this embodiment differs from the electronic device 1 shown in FIG. 5 in that the first transmission spectrum of the first dielectric layer 220 of this embodiment and the transmittance of the second transmission spectrum in the wavelength range R2 may be less than 20%, so that light having the wavelength range R2 does not easily penetrate through the first dielectric layer 220 and the second dielectric layer 226, or the intensity of light penetrating through the first dielectric layer 220 and the second dielectric layer 226 maybe significantly reduced. Therefore, in the manufacturing method of the electronic device 2 of this embodiment, the light source capable of generating light with the wavelength range R2 or wavelength in the wavelength range R2 is selected in the step S14 of the second inspection process according to the colors or transmission spectrums of the first dielectric layer 220 and the second dielectric layer 226. The first dielectric layer 220 and the second dielectric layer 226 may include the yellow filter material, the green filter material, the red filter material or a black filter material. Since other parts of the electronic device 2 are similar to or the same as the electronic device 1 shown in FIG. 5, and the manufacturing method of the electronic device 2 is similar to or the same as the manufacturing method of the electronic device 1 shown in FIG. 1 to FIG. 5, they will not be detailed redundantly. In some embodiments, the electronic device 2 may optionally include the external component 40, the encapsulation structure 44 and/or the conductive adhesive 46 shown in FIG. 5. In some embodiments, the electronic device 2 may optionally include dummy pads 18b and dummy blocks 24b, but not limited thereto.

As shown in FIG. 6 and FIG. 7, for example, the first dielectric layer 220 may include the red filter material, and the second dielectric layer 226 may include the green filter material, so the first transmission spectrum may be, for example, the curve A as shown in FIG. 6, and the second transmission spectrum may be, for example, the curve B shown in FIG. 6. The above-mentioned wavelength range R2 may be, for example, from 440 nm to 485 nm, but not limited thereto. Since the transmittances of the curve A and the curve B in the wavelength range R2 are both less than 10%, the intensity of the light having the wavelength range R2 or the wavelength in the wavelength range R2 may be significantly reduced after the light penetrates through the first dielectric layer 220 and/or the second dielectric layer 226. Accordingly, in the step S16 of the second inspection process, the intensity of the light penetrating through the through holes 26a of the second dielectric layer 226 and being reflected by the second conductive layer 224 may be significantly greater than the intensity of the light emitted from the second dielectric layer 226, such that the definition of the through hole 26a of the second dielectric layer 226 and the conductive block 24a of the second conductive layer 24 may be increased without being interfered by patterns of other dielectric layers and conductive layers.

In the embodiment of FIG. 7, the third transmission spectrum of the third dielectric layer 230 and the transmittance of the fourth dielectric layer 234 in the wavelength range R2 may also be less than 20%. The third dielectric layer 230 and the fourth dielectric layer 234 may include, for example, the yellow filter material, the green filter material, the red filter material or the black filter material. As shown in FIG. 6 and FIG. 7, the third dielectric layer 230 including the yellow filter material (e.g., corresponding to the curve F) and the fourth dielectric layer 234 including the black filter material are as an example, and the intensity of the light having the wavelength range R2 after penetrating through the third dielectric layer 230 and the fourth dielectric layer 234 may be significantly reduced, so that the detecting definition of the through holes 30a of the third dielectric layer 230 and the conductive block 28a of the third conductive layer 28 and the detecting definition of the through holes 34a of the fourth dielectric layer 234 and the conductive block 32a of the fourth conductive layer 32 may be improved.

Figure 8:
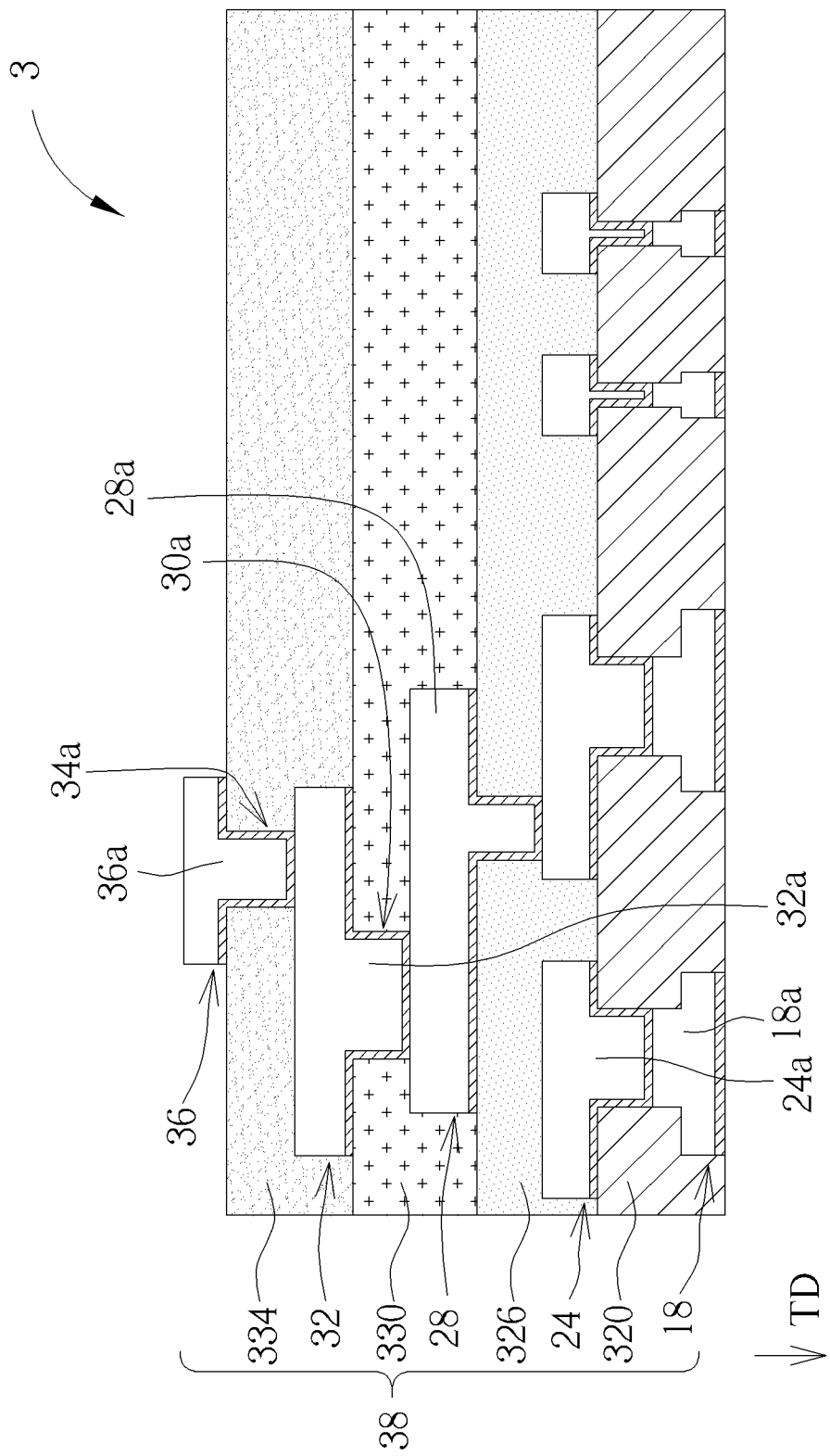
FIG. 8 schematically illustrates a cross-sectional view of an electronic device according to another embodiment of the present disclosure.

FIG. 8 schematically illustrates a cross-sectional view of an electronic device according to another embodiment of the present disclosure. For clarity, FIG. 8 shows a part of the cross-sectional structure, but not limited thereto. As shown in FIG. 8, the electronic device 3 provided by this embodiment differs from the electronic device 2 shown in FIG. 7 in that the first transmission spectrum of the first dielectric layer 320 and the second transmission spectrum of the second dielectric layer 326 of this embodiment have a wavelength range R3 in which the transmittance is less than 20%. The wavelength range R3 may be, for example, from 500 nm to 565 nm. For example, the first dielectric layer 320 and the second dielectric layer 326 may include the blue filter material, the red filter material, the magenta filter material or the black filter material. In the manufacturing method of the electronic device 3 of this embodiment, the light source capable of generating light with the wavelength range R3 or wavelength in the wavelength range R3 is selected in the step S14 of the second inspection process according to the colors or transmission spectrums of the first dielectric layer 320 and the second dielectric layer 326. Since other parts of the electronic device 3 are similar to or the same as the electronic device 1 shown in FIG. 5, and the manufacturing method of the electronic device 3 is similar to or the same as the manufacturing method of the electronic device 1 shown in FIG. 1 to FIG. 5, they will not be detailed redundantly. In some embodiments, the electronic device 3 may optionally include the external component 40, the encapsulation structure 44 and/or the conductive adhesive 46 shown in FIG. 5. In some embodiments, the electronic device 3 may optionally include dummy pads 18b and dummy blocks 24b, but not limited thereto.

As shown in FIG. 6 and FIG. 8, for example, the first dielectric layer 320 may include the blue filter material, and the second dielectric layer 326 may include the red filter material, so the first transmission spectrum may be, for example, the curve C shown in FIG. 6, and the second transmission spectrum may be, for example, the curve A shown in FIG. 6. The above-mentioned wavelength range R3 may be, for example, from 500 nm to 565 nm, but not limited thereto. Since the transmittance of the curve A in the wavelength range R3 is less than 10%, and the transmittance of the curve C in the wavelength range R3 is less than 20%, the intensity of the light having the wavelength range R3 or the wavelength in the wavelength range R3 after penetrating through the first dielectric layer 320 and/or the second dielectric layer 326 may be significantly decreased. Therefore, in the step S16 of the second inspection process, the intensity of the light penetrating through the through hole 26a of the second dielectric layer 326 and being reflected by the second conductive layer 24 may be significantly greater than the intensity of the light emitted from the second dielectric layer 326. Accordingly, the detecting definition of the through hole 26a of the second dielectric layer 326 and the conductive block 24a of the second conductive layer 24 may be improved without being interfered by patterns of other dielectric layers and conductive layers.

In the embodiment of FIG. 8, the transmittance of the third transmission spectrum of the third dielectric layer 330 and the transmittance of the fourth dielectric layer 334 in the wavelength range R3 may also be less than 20%. For example, the third dielectric layer 330 and the fourth dielectric layer 334 may include the blue filter material, the red filter material, the magenta filter material or the black filter material. As shown in FIG. 6 and FIG. 8, the third dielectric layer 330 including the black filter material and the fourth dielectric layer 334 including the magenta filter material (e.g., corresponding to the curve E) are as an example, and the intensity of the light having the wavelength range R3 after penetrating through the third dielectric layer 330 and the fourth dielectric layer 334 may be significantly reduced. Accordingly, the detecting definition of the through holes 30a of the third dielectric layer 330 and the conductive block 28a of the third conductive layer 28 and the detecting definition of the through holes 34a of the fourth dielectric layer 334 and the conductive block 32a of the fourth conductive layer 32 may be improved.

Figure 9:
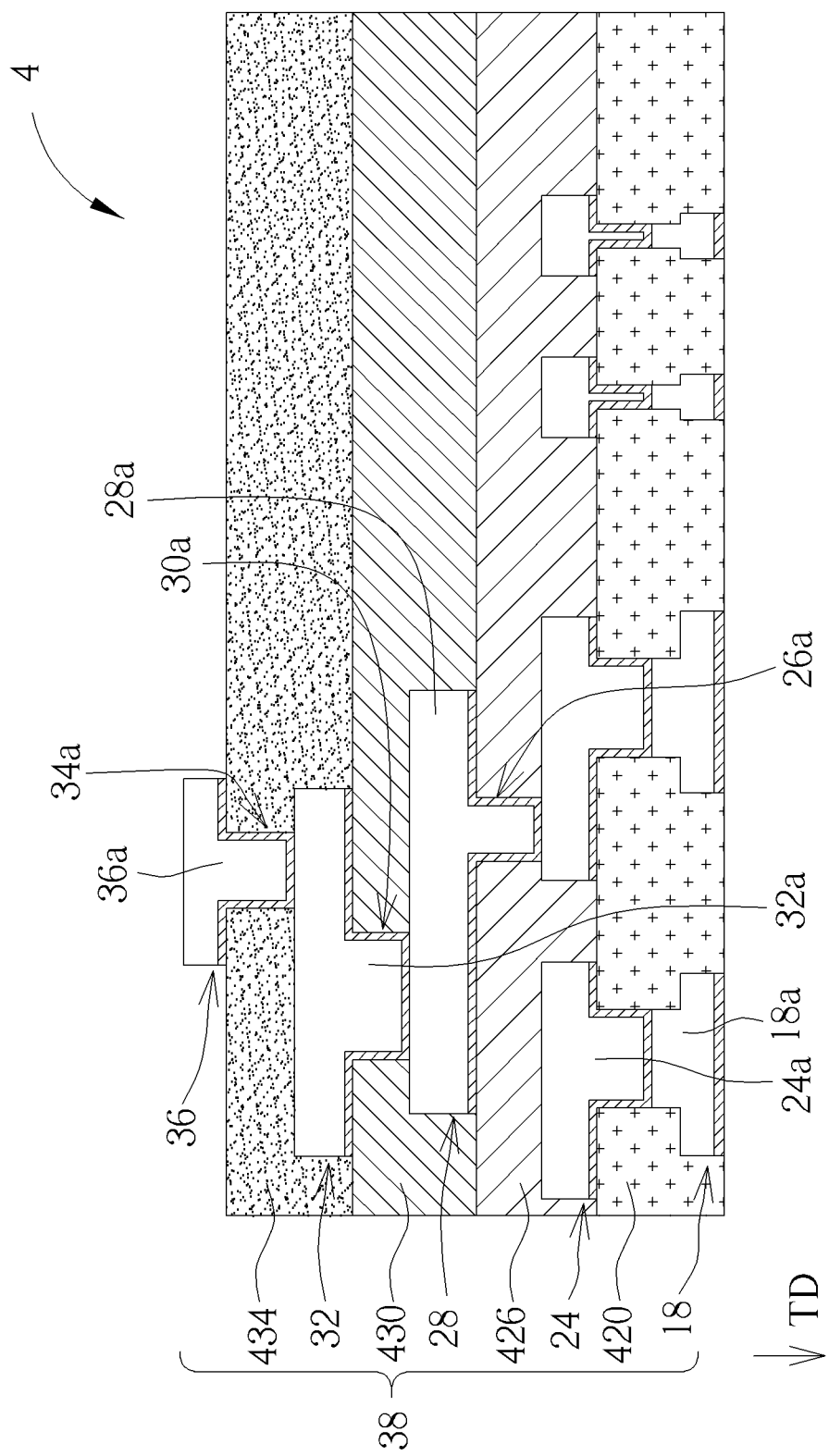
FIG. 9 schematically illustrates a cross-sectional view of an electronic device according to another embodiment of the present disclosure.

FIG. 9 schematically illustrates a cross-sectional view of an electronic device according to another embodiment of the present disclosure. For clarity, FIG. 9 shows a part of the cross-sectional structure, but not limited thereto. As shown in FIG. 9, the electronic device 4 provided in this embodiment differs from the electronic device 2 shown in FIG. 7 in that the first transmission spectrum of the first dielectric layer 420 of this embodiment and the second transmission spectrum of the second dielectric layer 426 of this embodiment have a wavelength range R4 in which the transmittance is less than 20%. The wavelength range R4 may, for example, be from 625 nm to 740 nm. For example, the first dielectric layer 420 and the second dielectric layer 426 may include the cyan filter material, the blue filter material, the green filter material or the black filter material. In the manufacturing method of the electronic device 4 of this embodiment, the light source capable of generating light with the wavelength range R4 or wavelength in the wavelength range R4 is selected in the step S14 of the second inspection process according to the colors or transmission spectrums of the first dielectric layer 420 and the second dielectric layer 426. Since other parts of the electronic device 4 are similar to or the same as the electronic device 1 shown in FIG. 5, and the manufacturing method of the electronic device 4 is similar to or the same as the manufacturing method of the electronic device 1 shown in FIG. 1 to FIG. 5, they will not be detailed redundantly. In some embodiments, the electronic device 4 may optionally include the external component 40, the encapsulation structure 44 and/or the conductive adhesive 46 shown in FIG. 5. In some embodiments, the electronic device 4 may optionally include dummy pads 18b and dummy blocks 24b, but not limited thereto.

As shown in FIG. 6 and FIG. 9, for example, the first dielectric layer 420 may include the black filter material, and the second dielectric layer 426 may include the blue filter material, so the second transmission spectrum may be, for example, the curve C shown in FIG. 6. Since the transmittance of the curve C in the wavelength range R4 is less than 10%, and the transmittance of the black filter material in the wavelength range R4 is also less than 10%, the intensity of the light having the wavelength range R4 or the wavelength in the wavelength range R4 after penetrating through the first dielectric layer 420 and/or the second dielectric layer 426 may be significantly decreased. Therefore, in the step S16 of the second inspection process, the intensity of the light penetrating through the through hole 26a of the second dielectric layer 426 and being reflected by the second conductive layer 24 may be significantly greater than the intensity of the light emitted from the second dielectric layer 426. Accordingly, the detecting definition of the through hole 26a of the second dielectric layer 426 and the conductive block 24a of the second conductive layer 24 may be improved without being interfered by patterns of other dielectric layers and conductive layers.

In the embodiment of FIG. 9, the transmittance of the third transmission spectrum of the third dielectric layer 430 and the transmittance of the fourth dielectric layer 434 in the wavelength range R4 may also be less than 20%. For example, the third dielectric layer 430 and the fourth dielectric layer 434 may include the cyan filter material, the blue filter material, the green filter material or the black filter material. As shown in FIG. 6, the third dielectric layer 430 including the green filter material and the fourth dielectric layer 434 including the cyan filter material are as an example, and the intensity of the light having the wavelength range R4 after penetrating through the third dielectric layer 430 and the fourth dielectric layer 434 may be significantly reduced. Accordingly, the detecting definition of the through holes 30a of the third dielectric layer 430 and the conductive block 28a of the third conductive layer 28 and the detecting definition of the through holes 34a of the fourth dielectric layer 434 and the conductive block 32a of the fourth conductive layer 32 may be improved. According to some embodiments of the present disclosure, the first dielectric layer 420 and the third dielectric layer 430 may have the same filter material, such as the red filter material, and the second dielectric layer 426 and the fourth dielectric layer 434 may have the same filter material, such as the green filter material, but not limited thereto.

Figure 10:
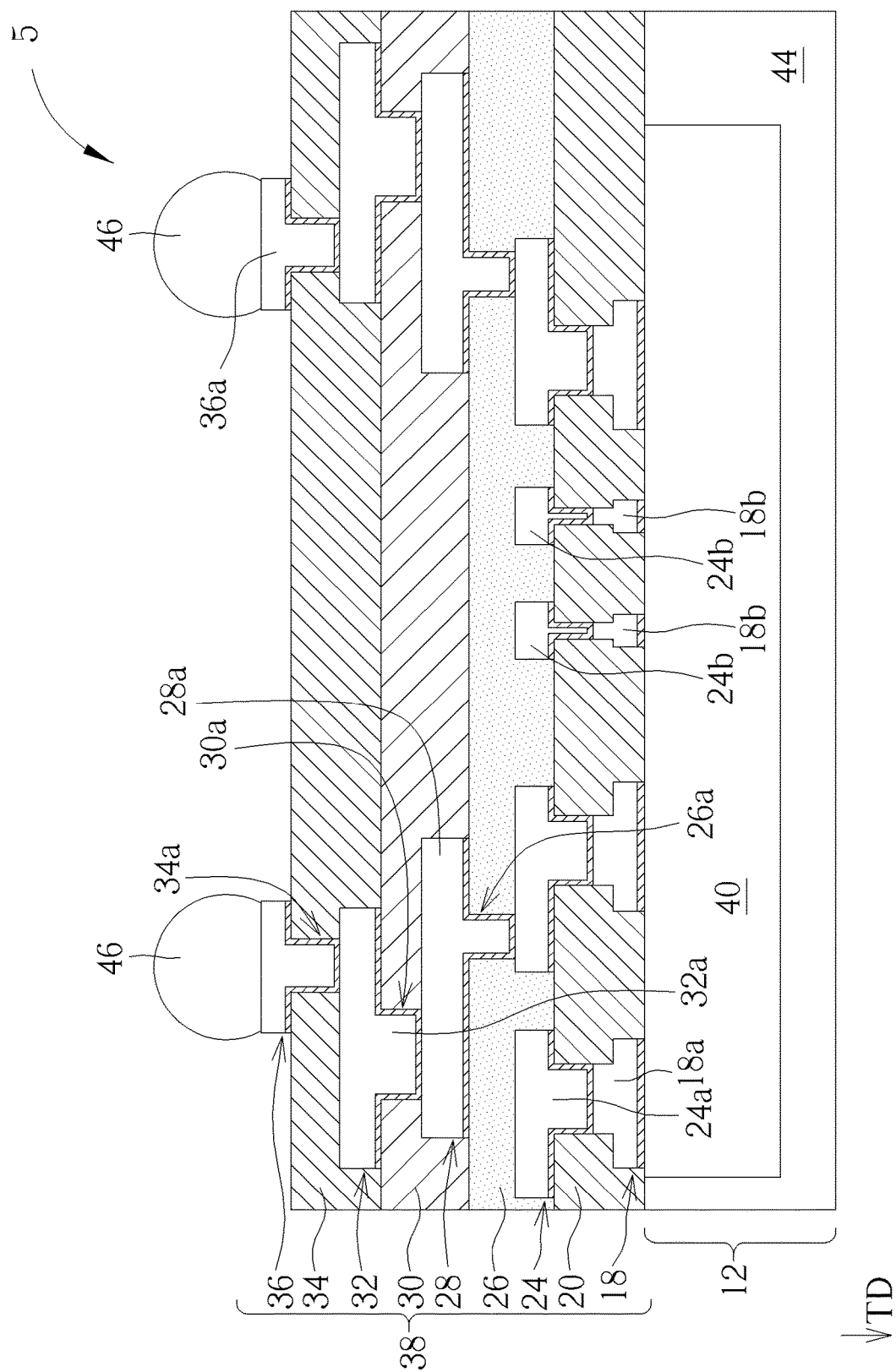
FIG. 10 schematically illustrates a cross-sectional view of an electronic device according to another embodiment of the present disclosure.

FIG. 10 schematically illustrates a cross-sectional view of an electronic device according to another embodiment of the present disclosure. As shown in FIG. 10, the electronic device 5 provided by this embodiment differs from the electronic device 1 shown in FIG. 5 in that the connector 38 may be disposed on the carrier 12, and the carrier 12 may be included in the electronic device 5. In other words, in the method of manufacturing the electronic device 5, the connector 38 may be formed on the carrier 12, and the carrier 12 does not need to be removed after the connector 38 is formed. The connector 38 maybe formed by, for example, a chip first process, but not limited thereto. The carrier 12 may include, for example, a wafer, an external component 40, an external component 40 surrounded by an encapsulation structure 44, or other components suitable for carrying the connector 38 without being removed from the connector 38. The external component 40 may include, for example, a chip, but not limited thereto. In the embodiment of FIG. 10, the carrier 12 may include the external component 40 and the encapsulation structure 44, in which the connector 38 may be disposed on the external component 40, and the encapsulation structure 44 at least surrounds sides of the external component 40, but not limited thereto. In some embodiments, the encapsulation structure 44 may be disposed on a surface of the external component 40 opposite to the connector 38, or a surface of the external component 40 opposite to the connector 38 may be exposed to facilitate heat dissipation. Although not shown in the figures, the external component 40 may have a plurality of pads, and the connector 38 may, for example, be electrically connected to the corresponding pads, but not limited thereto. In some embodiments, the connector 38 may not include the lower pad, but the connector 38 may be directly formed on the pads of the external component 40, so that the conductive block 24a of the conductive layer 24 may be electrically connected to the pads, but the present disclosure is not limited thereto. In some embodiments, the connector 38 may also adopt the connector of any one of the above-mentioned embodiments, and the lower pad of the connector 38 is disposed on the corresponding pads of the external component 40. Since other parts of the connector 38 of FIG. 10 may be the same as any one of the connectors 38 shown in FIG. 5 and FIG. 7 to FIG. 9, they are not detailed redundantly.

In the manufacturing method of the electronic device 5 shown in FIG. 10, the external component 40 may be disposed on another carrier (not shown) by a chip-first process with its surface having the pads facing down, and an encapsulation process is then performed to form the encapsulation structure 44 on the external component 40 to protect the external component from damaging. Next, the another carrier is removed, and the external component 40 and the encapsulation structure 44 are turned upside down, so that the surface of the external component 40 having the pads faces up. Then, the connector 38 is formed on the external component 40 and the encapsulation structure 44, but the present disclosure is not limited thereto. After the connector 38 or other subsequent processes are completed, the connector 38 may be cut to form the electronic device 5 including the external component 40. In some embodiments, conductive adhesive 46 or conductive bumps maybe optionally disposed on the upper pads 36a of the connector 38 to facilitate electrical connection to other electronic components, but not limited thereto.

Figure 11:
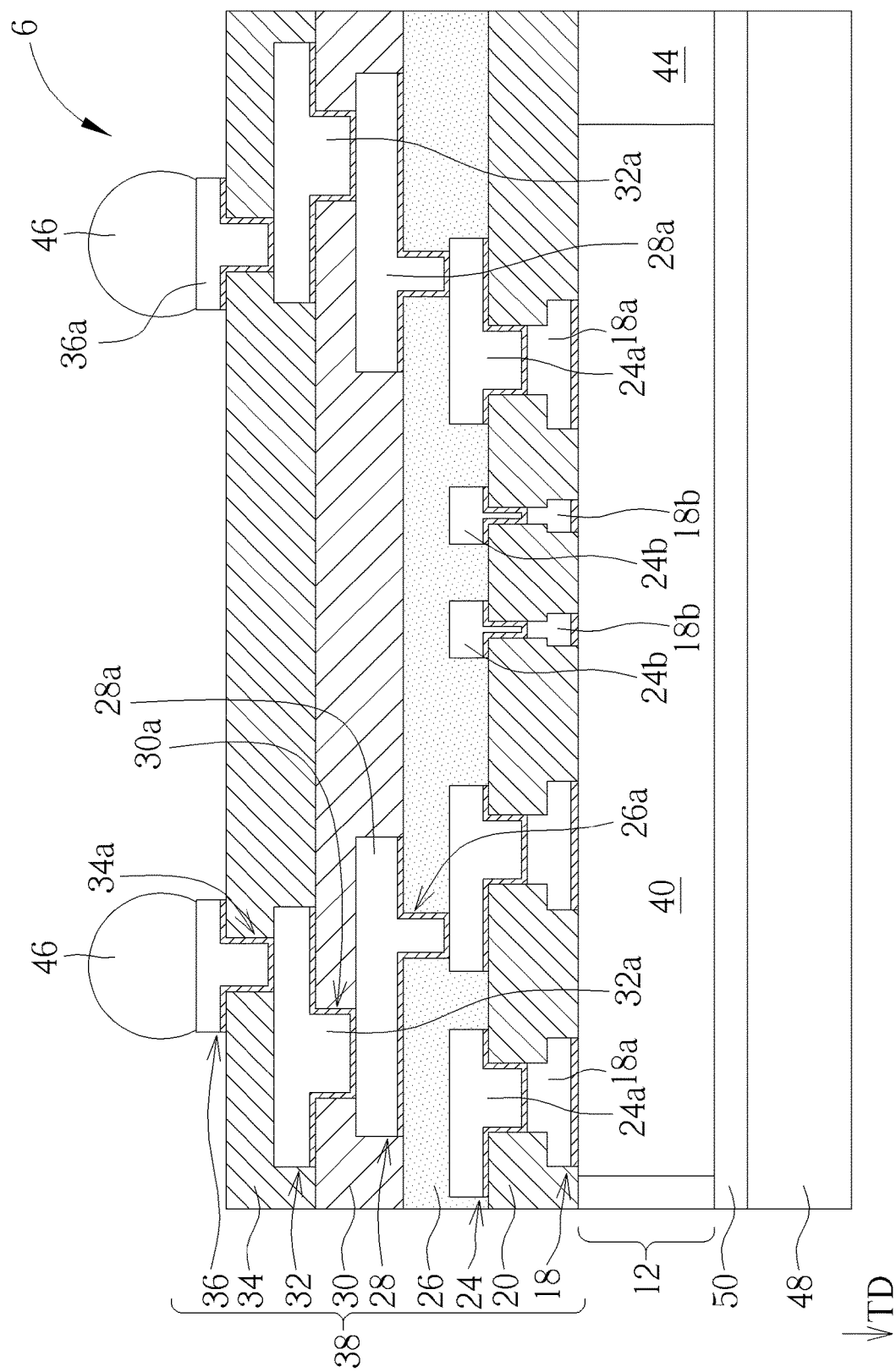
FIG. 11 schematically illustrates a cross-sectional view of an electronic device according to another embodiment of the present disclosure.

FIG. 11 schematically illustrates a cross-sectional view of an electronic device according to another embodiment of the present disclosure. As shown in FIG. 11, the method of manufacturing the electronic device 6 provided by this embodiment differs from the method of manufacturing the electronic device 5 shown in FIG. 10 in that the external component 40 is disposed on another carrier 48 by a chip-first process with its surface having the pads facing up, and an encapsulation process is then performed to form encapsulation structure 44 on a top and the sides of the external component 40. In some embodiments, a release layer 50 may be disposed between the carrier 48 and the external component 40, for example. The release layer 50 may be, for example, the same as or similar to the release layer 14, but not limited thereto. Then, through a polishing process, such as a chemical mechanical polishing (CMP) process, the encapsulation structure 44 is thinned to expose the pads of the external component 40. Next, the connector 38 is formed on the external component 40 and the encapsulation structure 44. The method of forming the connector 38 may be, for example, the same as or similar to the method of forming the redistribution layer in any one of the above-mentioned embodiments, and thus, they will not be detailed redundantly. After the connector 38 or other subsequent processes are completed, the connector 38 may be cut to form the electronic device 6 including the external component 40. In some embodiments, conductive adhesive 46 or conductive bumps maybe optionally disposed on the upper pads 36a of the connector 38. Since other structures and manufacturing method of the electronic device 6 in FIG. 11 may be the same as or similar to those in the electronic device 5 in FIG. 10, and the connector 38 in FIG. 11 may be the same as any one of the connectors 38 shown in FIG. 5 and FIG. 7 to FIG. 9, they are not detailed redundantly.

In summary, in the electronic device of the present disclosure, contrast between the patterns of the upmost dielectric layer and the upmost conductive layer and patterns of other dielectric layers and other conductive layers during inspection may be increased by installing the transmission spectra of any two adjacent dielectric layers to have different transmittances for the same inspection light, installing the transmission spectra of any two adjacent dielectric layers to have transmittances of less than 20% for the same inspection light, or installing the colors of any two adjacent dielectric layers to be different. Therefore, the detection rate of defects may be improved, or the inspection time is shortened.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. An electronic device, comprising:
a connector comprising a conductive layer, a first dielectric layer, and a second dielectric layer, wherein the second dielectric layer is disposed on the first dielectric layer, the conductive layer is disposed between the first dielectric layer and the second dielectric layer, the first dielectric layer has a first transmittance for a light, the second dielectric layer has a second transmittance for the light, and the first transmittance is different from the second transmittance.

2. The electronic device according to claim 1, wherein the second transmittance is greater than the first transmittance.

3. The electronic device according to claim 1, wherein a difference between the second transmittance and the first transmittance is greater than or equal to 10%.

4. The electronic device according to claim 1, wherein the light is white light.

5. The electronic device according to claim 1, wherein one of the first dielectric layer and the second dielectric layer comprises one of a green filter material, a yellow filter material, a blue filter material, and a red filter material, and another one of the first dielectric layer and the second dielectric layer comprises another one of the green filter material, the yellow filter material, the blue filter material, and the red filter material.

6. The electronic device according to claim 1, wherein the first dielectric layer and the second dielectric layer comprise a yellow filter material, a green filter material, a red filter material or a black filter material.

7. The electronic device according to claim 1, wherein the first dielectric layer comprises at least one through hole, and the conductive layer comprises at least one conductive block extend from a top of the first dielectric layer into the at least one through hole.

8. The electronic device according to claim 7, wherein the conductive layer further comprises a dummy block electrically insulated from the at least one conductive block.

9. The electronic device according to claim 7, wherein the connector comprises another conductive layer disposed under the first dielectric layer, and the another conductive layer comprises at least one lower pad electrically connected to the at least one conductive block.

10. A manufacturing method of an electronic device, comprising:
providing a carrier; and
forming a connector on the carrier, wherein the connector comprises a first dielectric layer and a second dielectric layer, the second dielectric layer is disposed on the first dielectric layer, the second dielectric layer is farther away from the carrier than the first dielectric layer,
wherein the first dielectric layer has a first transmittance for a light, the second dielectric layer has a second transmittance for the light, and the first transmittance is different from the second transmittance.

11. The manufacturing method of the electronic device according to claim 10, wherein the second transmittance is greater than the first transmittance.

12. The manufacturing method of the electronic device according to claim 10, wherein a difference between the second transmittance and the first transmittance is greater than or equal to 10%.

13. An inspection method of an electronic device, comprising:
providing a carrier;
forming a connector on the carrier, wherein the connector comprises a first dielectric layer and a second dielectric layer, the second dielectric layer is disposed on the first dielectric layer, the second dielectric layer is farther away from the carrier than the first dielectric layer; and
providing a light source for inspecting the connector, wherein the light source generates a first light penetrating through the second dielectric layer to form a second light, the first dielectric layer has a first transmittance for the second light, the second dielectric layer has a second transmittance for the second light, and the first transmittance is different from the second transmittance.

14. The inspection method of the electronic device according to claim 13, wherein the second transmittance is greater than the first transmittance.

15. The inspection method of the electronic device according to claim 13, wherein a difference between the second transmittance and the first transmittance is greater than or equal to 10%.

16. The inspection method of the electronic device according to claim 13, wherein the first dielectric layer and the second dielectric layer comprise a yellow filter material, a green filter material, a red filter material or a black filter material.

17. The inspection method of the electronic device according to claim 13, wherein the connector further comprises a conductive layer, the conductive layer comprises at least one conductive block, and the second dielectric layer comprises at least one first through hole exposing the at least one conductive block.

18. The inspection method of the electronic device according to claim 17, wherein the first dielectric layer comprises at least one second through hole, and the at least one conductive block extend from a top of the first dielectric layer into the at least one second through hole.

19. The inspection method of the electronic device according to claim 17, wherein the connector comprises another conductive layer disposed under the first dielectric layer, and the another conductive layer comprises at least one lower pad electrically connected to the at least one conductive block.

* * * * *